(12) United States Patent
Suzuki et al.

(10) Patent No.: US 6,875,936 B1
(45) Date of Patent: Apr. 5, 2005

(54) MICROMACHINE SWITCH AND ITS PRODUCTION METHOD

(75) Inventors: Kenichiro Suzuki, Tokyo (JP); Tsunehisa Marumoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/869,107

(22) PCT Filed: Dec. 20, 1999

(86) PCT No.: PCT/JP99/07137

§ 371 (c)(1),
(2), (4) Date: Dec. 17, 2001

(87) PCT Pub. No.: WO00/38209

PCT Pub. Date: Jun. 29, 2000

(30) Foreign Application Priority Data

Dec. 22, 1998 (JP) .......................................... 10-365690

(51) Int. Cl.[7] .............................................. H01H 57/00
(52) U.S. Cl. ...................................... 200/181; 200/262
(58) Field of Search ......................... 200/181, 262–270; 342/373, 383, 372, 368, 375; 333/105, 262; 343/754, 844, 826, 853, 776

(56) References Cited

U.S. PATENT DOCUMENTS

| | | | | |
|---|---|---|---|---|
| 4,959,515 A | * | 9/1990 | Zavracky et al. | 200/181 |
| 5,258,591 A | * | 11/1993 | Buck | 200/181 |
| 5,578,976 A | * | 11/1996 | Yao | 333/262 |
| 5,673,785 A | * | 10/1997 | Schlaak et al. | 200/245 |
| 6,046,659 A | * | 4/2000 | Loo et al. | 200/181 |
| 6,054,659 A | * | 4/2000 | Lee et al. | 200/181 |
| 6,094,116 A | * | 7/2000 | Tai et al. | 335/78 |
| 6,115,231 A | * | 9/2000 | Shirakawa | 361/233 |
| 6,191,671 B1 | * | 2/2001 | Schlaak et al. | 335/78 |
| 6,194,678 B1 | * | 2/2001 | Yoshikawa et al. | 200/512 |
| 6,310,339 B1 | * | 10/2001 | Hsu et al. | 250/214.1 |
| 6,384,353 B1 | * | 5/2002 | Huang et al. | 200/181 |
| 6,396,369 B1 | * | 5/2002 | Schlitz et al. | 335/16 |
| 6,440,767 B1 | * | 8/2002 | Loo et al. | 438/52 |
| 6,483,056 B2 | * | 11/2002 | Hyman et al. | 200/181 |
| 6,486,425 B2 | * | 11/2002 | Seki | 200/181 |
| 6,506,989 B2 | * | 1/2003 | Wang | 200/181 |
| 6,566,617 B1 | * | 5/2003 | Suzuki et al. | 200/181 |
| 6,621,022 B1 | * | 9/2003 | Ma et al. | 200/267 |
| 6,621,387 B1 | * | 9/2003 | Hopcroft | 333/262 |
| 6,646,215 B1 | * | 11/2003 | Nelson | 200/181 |
| 6,649,852 B2 | * | 11/2003 | Chason et al. | 200/181 |
| 6,657,525 B1 | * | 12/2003 | Dickens et al. | 335/78 |
| 6,706,981 B1 | * | 3/2004 | Ma et al. | 200/181 |
| 6,713,695 B2 | * | 3/2004 | Kawai et al. | 200/181 |
| 6,731,492 B2 | * | 5/2004 | Goodwin-Johansson | 361/233 |

FOREIGN PATENT DOCUMENTS

| | | | | |
|---|---|---|---|---|
| EP | 001150318 A1 | * | 10/2001 | 200/181 |
| JP | 2-260333 | | 10/1990 | |
| JP | 4-370622 | | 12/1992 | |
| JP | 5-2972 | | 1/1993 | |
| JP | 5-2973 | | 1/1993 | |
| JP | 5-54782 | | 3/1993 | |
| JP | 6-267926 | | 9/1994 | |
| JP | 7-14490 | | 1/1995 | |

(Continued)

Primary Examiner—Elvin Enad
Assistant Examiner—Lisa Klaus
(74) Attorney, Agent, or Firm—Young & Thompson

(57) ABSTRACT

A micro-machine switch in accordance with the present invention includes a supporter having a predetermined height relative to a surface of a substrate, a flexible cantilever projecting from the supporter in parallel with a surface of the substrate, and having a distal end facing a gap formed between two signal lines, a contact electrode formed on the cantilever, facing the gap, a lower electrode formed on the substrate in facing relation with a part of the cantilever, and an intermediate electrode formed on the cantilever in facing relation with the lower electrode. The micro-machine switch can operate at a lower drive voltage than a voltage at which a conventional micro-machine switch operates, and can enhance a resistance of an insulating film against a voltage.

140 Claims, 17 Drawing Sheets

FOREIGN PATENT DOCUMENTS

| | | |
|---|---|---|
| JP | 8-213803 | 8/1996 |
| JP | 8-509093 | 9/1996 |
| JP | 9-17300 | 1/1997 |
| JP | 9-213191 | 8/1997 |
| JP | 2693065 | 9/1997 |
| JP | 9-251834 | 9/1997 |
| JP | 10-149757 | 6/1998 |
| JP | 11-74717 | 3/1999 |
| JP | 11-204013 | 7/1999 |
| JP | 2000188049 A * 7/2000 | ................. 200/181 |

* cited by examiner

MICROMACHINE SWITCH AND ITS PRODUCTION METHOD

BACKGROUND OF THE INVENTION

1. Field of the Invention

The invention relates to a micro-machine switch and a method of fabricating the same, and more particularly to a micro-machine switch which can conduct on-off control in a current ranging from a direct current (DC) to an alternating current having a frequency of GHz or greater, and a method of fabricating the same.

2. Description of the Related Art

There have been suggested many micro-machines. Hereinbelow is explained a micro-machines switch, as an example, suggested in Japanese Unexamined Patent Publication No. 9-17300.

FIG. 1A is a plan view of the micro-machine switch suggested in the Publication, and FIG. 1B is a longitudinal cross-sectional view taken along the line E–E' in FIG. 1A.

As illustrated in FIGS. 1A and 1B, an anchor structure 52 composed of thermosetting polyimide, a lower electrode 53 composed of gold, and a pair of signal lines 54 composed of gold are formed on a substrate 51 composed of gallium arsenide. As illustrated in FIG. 1A, the pair of signal lines 54 is arranged such that ends of the signal lines spaced away from and faces each other.

A cantilever 55 composed of a silicon dioxide film is supported on the anchor structure 52. The cantilever 55 extends to the signal lines 54 beyond the lower electrode 53, and faces both the lower electrode 53 and the signal lines 54 with a spatial gap therebetween.

An upper electrode 56 composed of aluminum is formed on an upper surface of the cantilever 55. The upper electrode 56 extends from the anchor structure 52 to a location at which the upper electrode 56 faces the lower electrode 53.

A contact electrode 57 is formed on a lower surface of the cantilever 55 in facing relation with the signal lines 64.

The micro-machine switch having the above-mentioned structure operates as follows.

When a voltage of 30V is applied across the upper electrode 56 and the lower electrode 53, an electrostatic force is exerted on the upper electrode 56 as an attractive force towards the substrate 51 (downwardly along an arrow 58). As a result, the cantilever 55 is deformed towards the substrate 51 with the anchor structure 52 acting as a fulcrum, thereby the contact electrode 57 makes contact with the ends of the signal lines 54.

In a normal condition, as illustrated in FIG. 1B, there is a gap between the contact electrode 57 and the signal lines 54, and the signal lines 54 are spaced away from each other. Hence, in a condition in which a voltage is not applied to the lower electrode 53, a current does not run through the signal lines 54.

In contrast, when a voltage is applied to the lower electrode 53, and resultingly, the contact electrode 57 makes contact with the signal lines 54, the signal lines 54 make electrical contact with each other through the contact electrode 57. Thus, a current runs through the signal lines 54.

As mentioned above, by applying a voltage to the lower electrode 53 or stopping application of a voltage to the lower electrode 53, it is possible to cause a current to run or not to run through the signal lines 54, or control on/off of a signal running through the signal lines 54.

In order to reduce a loss in the switch, it is important to sufficiently electrically insulate the upper electrode 56 and the contact electrode 57 from each other. If the upper electrode 56 and the contact electrode 57 are electrically connected to each other, a signal (including a direct current) running through the signal lines 54 would run also through the upper electrode 56, resulting in deterioration in switch characteristics.

Even if the upper electrode and the contact electrode 57 are not electrically connected to each other, an alternating current running through the signal lines 54 runs further through the upper electrode 56 under a circumstance where electrostatic capacity is so great.

As mentioned above, if the upper electrode 56 and the contact electrode 57 are not sufficiently electrically insulated from each other, a signal leaks out of the signal lines 54, resulting in deterioration in switch characteristics.

It was found out that the conventional micro-machine switch illustrated in FIGS. 1A and 1B is accompanied with the following problems.

It is necessary to apply a sufficient voltage across the upper electrode 56 and the lower electrode 53 such that a resultant electrostatic force overcomes a restoring force of the cantilever 55, in order to turn the switch on, namely, to cause the contact electrode 57 to make contact with the signal lines 54. A produced electrostatic force is in inverse proportion to $(D-W)^2$ wherein D indicates a distance between the upper electrode 56 and the lower electrode 53, and W indicates a thickness of the cantilever 55. Accordingly, since the thickness W of the cantilever 55 is constant, it is important to design the distance D as small as possible.

In the micro-machine switch illustrated in FIGS. 1A and 1B, the distance D between the upper electrode 56 and the lower electrode 53 is greater than a sum of the thickness W of the cantilever 55 and a distance S between the contact electrode 57 and the signal lines 54 by a thickness Wa of the contact electrode 57, as illustrated in FIG. 1B.

For instance, in order to reduce a loss in a signal in application of a micro-machine switch to a radio-frequency, it would be necessary to design the contact electrode 57 and the signal lines 54 to have a thickness of about 2 $\mu$m.

It would be necessary to space the signal lines 54 and the contact electrode 57 from each other by 4 $\mu$m or greater, in order to reduce electrostatic capacity coupling between the signal lines 54 and the contact electrode 57 when the switch is off. Hence, the upper electrode 56 and the lower electrode 53 are spaced away from each other by a sum of the thickness W of the cantilever 55 and 6 $\mu$m (4 $\mu$m+2 $\mu$m).

It was found out by the inventors that a high voltage, specifically, a voltage of about 100V has to be applied across the upper electrode 56 and the lower electrode 53, when an area in which the upper electrode 56 overlaps the lower electrode 53 is equal to 10,000 $\mu m^2$, and the cantilever 55 has a width of 20 $\mu$m and a length of 130 $\mu$m.

Though it is possible to reduce a restoring force of the cantilever 55 by designing the cantilever 55 to have a greater length or a smaller width, such increasing a length or decreasing a width might cause breakage of the cantilever 55 during fabrication of a device or during operation of a device.

On the other hand, it would be possible to generate a greater electrostatic force, and hence, reduce an applied voltage by increasing an area in which the upper electrode 56 and the lower electrode 53 overlap each other. However, this causes an increase in a size of a device.

In the conventional micro-machine switches, an applied voltage is reduced in accordance with the above-mentioned method. However, the above-mentioned method is accompanied with a problem that a device would have an increased size. Thus, there is a limit in the conventional methods to reduce a size of the micro-machine switch.

In addition, since a high voltage, specifically, a voltage of about 100V is applied across the upper and lower electrodes, the cantilever 55 would be required to be composed of a qualified film, in order to prevent a device from being destroyed by dielectric breakdown.

However, in the method in which the cantilever 65 in the conventional micro-machine switch illustrated in FIGS. 1A and 1B is formed of an oxide film on the contact electrode 57 composed of gold, by low-temperature deposition process (plasma-enhanced CVD process to be carried out at 250 degrees centigrade or smaller), it would be quite difficult or almost impossible to form such an oxide film having a sufficient resistance to a voltage.

In addition, as an applied voltage becomes high, power consumption in a driver circuit increases. It was found out that the micro-machine switch could not be applied to an antenna having a plurality of switches, in particular.

Many micro-machine switches have been suggested in addition to the above-mentioned micro-machine switch illustrated in FIGS. 1A and 1B.

For instance, Japanese Unexamined Patent Publication No. 2-260333 has suggested a method of fabricating a micro-machine switch, comprising the steps of forming an epitaxial layer having a second electrical conductivity, on a silicon semiconductor substrate having a first electrical conductivity, forming a silicon dioxide film on the epitaxial layer, removing the silicon dioxide film in a predetermined area to thereby form an opening, and partially removing the epitaxial layer located below the silicon dioxide film, through the opening, by electrochemical etching.

Japanese Unexamined Patent Publication No. 6-267926 has suggested a method of fabricating a micro-machine switch, including the step of etching through the use of a silicon nitride layer as an etching mask or an etching stopper layer. The silicon nitride layer has a stress a defined by the following equation.

$$|\sigma| \leq 3 \times 10^9 \ dyn/cm^2$$

Japanese Patent No. 2693065 (Japanese Unexamined Patent Publication No. 4-306520) has suggested a micro-machine switch comprised of a substrate composed of dielectric material and having a planar surface, first and second transmission line segments formed on the substrate and spaced away from each other, a hub attached to a surface of the substrate, a switch blade fastened to the hub such that the switch blade is rotatable around the hub, and a control pad formed on the substrate, and receiving control signals to generate an electrostatic field for rotating the switch blade between an open position and a closed position. The switch blade is composed of an electrically conductive material, and has such a dimension that the switch blade electrically closes a circuit electrically connecting the first and second transmission line segments to each other, when the switch blade is rotated to the closed position.

Japanese Unexamined Patent Publication No. 4-370622 has suggested an electrostatic relay including a movable substrate and a fixed substrate both of which are composed of an electrically conductive material.

Japanese Unexamined Patent Publication No. 9-213191 has suggested a micro-machine switch comprised of a support beam comprised of a connector fixed on an insulating substrate and a movable supporter spaced away from the insulating substrate by a certain gap, a first electrode formed on the insulating substrate below the movable supporter, and a second electrode formed on a surface of the movable supporter in facing relation with the first electrode, and spaced away from the first electrode by a certain gap.

Japanese Unexamined Patent Publication No. 8-509093 has suggested a relay comprised of a first substrate formed with a cavity and composed of polycrystal material, a bridge formed across the cavity on the first substrate, a first electrical contact formed at a center of the bridge, a second substrate including a second electrical contact arranged to be engaged to the first electrical contact, and composed of insulating material, means for displacing the second electrical contact from the first electrical contact, and means for selectively moving the bridge to thereby engage the first and second electrical contacts to each other.

Japanese Unexamined Patent Publication No. 10-149757 has suggested a semiconductor micro-relay including a driver, a resistance type potential dividing circuit, and a field effect transistor FET. A movable portion is carried at the driver by means of at least one hinge such that the movable portion is elastically deformable in a thickness-wise direction of the semiconductor micro-relay. A fixed driver electrode is formed on one of surfaces of the driver which surfaces face upper and lower surfaces of the movable portion. A strain resistor is formed on at least one hinge of the movable portion. The movable portion and the fixed driver electrode are electrically connected to input terminals of the driver. The resistance type potential dividing circuit is electrically connected to the strain resistor. The resistance type potential dividing circuit is electrically connected to both a gate and an output terminal of FET.

Japanese Unexamined Patent Publication No. 8-213803 has suggested a phase-shifter comprised of at least one switch including a plurality of switchable phase-shifting devices arranged in series, adjacent phase-shifting devices being electrically connected to each other, each of the phase-shifting devices including a deflectable device. The switch determines a degree of phase shifting to a signal running through the phase-shifting devices.

Japanese Unexamined Patent Publication No. 11-204013 has suggested an electrostatic movable contact device comprised of a movable driver electrode formed on a substrate, a fixed contact electrode formed on the substrate as a fixed contact, a supporting beam partially fixed to the substrate, a movable attractive electrode formed on the supporting beam in facing relation with the movable driver electrode, and a movable contact electrode formed on the supporting beam as a movable contact in facing relation with the fixed contact electrode. The supporting beam is moved by an electrostatic force generated between the movable driver electrode and the movable attractive electrode to thereby open or close a contact comprised of the fixed contact electrode and the movable contact electrode. A plurality of the movable driver electrodes is formed on the substrate, and has the same area.

Japanese Unexamined Patent Publication No. 5-2972 has suggested an electrostatic relay including a movable porting having both a movable contact formed on a lower surface of a first substrate and a fixed contact formed on an upper surface of a second substrate, and a supporting portion which supports the movable portion so that the movable portion is movable for connecting the movable contact to the fixed contact and disconnecting the movable contact from the fixed contact. The first and second substrates are positioned such that the movable and fixed contacts face each other. The movable portion is moved by an electrostatic force generated by application of a drive voltage across the driver electrodes of the first and second substrates. The first and second are composed of an electrically conductive material, and a relay driver circuit is formed on the first or second substrate.

Japanese Unexamined Patent Publication No. 5-2973 has suggested an electrostatic relay including a movable porting having both a movable contact formed on a lower surface of a first substrate and a fixed contact formed on an upper surface of a second substrate, and a supporting portion which supports the movable portion so that the movable portion is movable for connecting the movable contact to the fixed contact and disconnecting the movable contact from the fixed contact. The first and second substrates are positioned such that the movable and fixed contacts face each other. The movable portion is moved by an electrostatic force generated by application of a drive voltage across the driver electrodes of the first and second substrates. The first and second are composed, of an electrically conductive material, and an electret is formed between the first and second substrates for strengthening an electrostatic force by which the movable portion is moved.

Japanese Unexamined Patent Publication No. 5-54782 has suggested a micro-machine comprised of a fixed electrode layer formed on a principal plane of an electrically insulating substrate, and a movable piece composed of semiconductor single crystal and positioned in facing relation with the fixed electrode layer. The fixed electrode layer and the movable piece define opposing electrodes to be driven. The micro-machine is driven by an electrostatic attractive force generated by applying a dc voltage across the opposing electrodes. At least one of the fixed electrode layer and the movable piece is roughened at surfaces thereof facing each other.

Japanese Unexamined Patent Publication No. 7-14490 has suggested an electrostatically driven relay comprised of a fixed piece defining a fixed electrode, and a movable piece including a movable electrode facing and spaced away from the fixed electrode. The movable pieced is fixed at one end such that the other end moves towards the fixed electrode by an electrostatic force generated when an external voltage is applied across the fixed electrode and the movable electrode. Contacts which makes contacts with each other or separates from each other in accordance with movement of the movable piece are formed at both the end of the movable piece and an end of the fixed piece, associated with the end of the movable piece. The contacts are electrically connected to an external electric circuit. The movable piece is outwardly rounded at proximate ends of the other end.

Japanese Unexamined Patent Publication No. 9-251834 has suggested an electrostatic relay comprised of a frame-shaped base, a movable contact electrode including a movable electrode bridging over the base, and having a movable contact projecting from the movable electrode and movable electrode pieces in the form of a comb projecting from the movable electrode, a fixed electrode having fixed electrode pieces in the form of a comb, in mesh with the movable electrode pieces in non-contact condition, and a fixed contact engageable to a top surface of the movable contact. The movable contact electrode makes horizontal slide movement due to an electrostatic force generated by applying a voltage across the movable electrode pieces and the fixed electrode pieces to thereby cause a top surface of the movable contact to make contact with or separate away from a top surface of the fixed contact.

The above-mentioned problems remain unsolved even in the micro-machine switches or other devices suggested in the above-mentioned Publications.

SUMMARY OF THE INVENTION

In view of the above-mentioned problems, it is an object of the present invention to provide a micro-machine switch operable at a lower voltage than an operational voltage of a conventional micro-machine switch, and a method of fabricating the same.

It is also an object of the present invention to improve device characteristics by enhancing a breakdown voltage of an insulating film, if it is not possible to lower an applied voltage.

In one aspect of the present invention, there is provided a micro-machine switch electrically connecting a first signal line formed on a substrate to a second signal line or electrically disconnecting the first signal line from the second signal line, the second signal line being formed on the substrate and having an end spaced away from an end of the first signal line by a certain gap, characterized by a supporter formed on the substrate and having a predetermined height relative to a surface of the substrate, a flexible beam projecting from the supporter in parallel with a surface of the substrate, and having a distal end facing the gap, a contact electrode formed on a surface of the beam facing the substrate such that the contact electrode faces the gap, a lower electrode formed on the substrate in facing relation with a part of the beam, and an intermediate electrode formed on the beam in facing relation with the lower electrode.

It is preferable that the supporter and at least a part of the beam are composed of the same electrically conductive material and are formed integrally with each other.

For instance, the beam may be comprised of an electrical conductor extending from the supporter and having such a length that the electrical conductor faces the lower electrode, and an electrical insulator extending from a distal end of the electrical conductor and having such a length that the electrical insulator faces the gap, and the contact electrode may be formed on the electrical insulator in facing relation with the gap.

It is preferable that the electrical conductors define at least two cantilevers.

It is preferable that the beam further includes an upper electrode formed integrally with the electrical conductor on the electrical insulator.

It is preferable that the upper electrode extends across the intermediate electrode and the contact electrode.

It is preferable that the upper electrode and the electrical insulator are formed with a through-hole which passes through the upper electrode and the electrical insulator in alignment with the lower electrode.

It is preferable that the upper electrode, the electrical insulator and the contact electrode are formed with a through-hole which passes through the upper electrode, the electrical insulator and the contact electrode.

It is preferable that the upper electrode has a greater thickness than a thickness of the electrical insulator.

The supporter may be designed to have a floating potential.

It is preferable that the micro-machine switch further includes at least one second supporter formed on the substrate, and having a predetermined height relative to a surface of the substrate, in which case, it is preferable that the second supporter is connected to the beam through at least one arm projecting from the second supporter in parallel with a surface of the substrate.

It is preferable that the micro-machine switch further includes a second lower electrode formed on the substrate in facing relation with a part of the beam, and a second intermediate electrode formed on the beam in facing relation with the second lower electrode.

The present invention further provides a micro-machine switch electrically connecting a first signal line formed on a substrate to a second signal line or electrically disconnecting the first signal line from the second signal line, the second signal line being formed on the substrate and having an end spaced away from an end of the first signal line by a certain gap, characterized by a supporter formed on the substrate and having a predetermined height relative to a surface of the substrate, a flexible beam projecting from the supporter in parallel with a surface of the substrate, and having a distal end facing the gap, an electrical insulator making contact with a lower surface of the beam, and extending from the beam in a direction in which the beam extends, a contact electrode formed on a surface of the electrical insulator facing the substrate such that the contact electrode faces the gap, a lower electrode formed on the substrate in facing relation with a part of the beam, an intermediate electrode formed on the electrical insulator in facing relation with the lower electrode, and a reinforcement formed on the electrical insulator at a side opposite to the contact electrode in alignment with the contact electrode.

For instance, the reinforcement may be composed of silicon.

It is preferable that the supporter and at least a part of the beam are composed of the same electrically conductive material and are formed integrally with each other.

It is preferable that the beam includes at least two cantilevers.

It is preferable that the beam further includes an upper electrode formed integrally therewith on the electrical insulator.

It is preferable that the upper electrode and the electrical insulator are formed with a through-hole which passes through the upper electrode and the electrical insulator in alignment with the lower electrode.

It is preferable that the reinforcement, the electrical insulator and the contact electrode are formed with a through-hole which passes through the upper electrode, the electrical insulator and the contact electrode.

It is preferable that the micro-machine further includes at least one second supporter formed on the substrate, and having a predetermined height relative to a surface of the substrate, in which case, it is preferable that the second supporter being connected at its lower surface to the electrical insulator through a second beam projecting from the second supporter in parallel with a surface of the substrate.

It is preferable that the micro-machine switch further includes a second lower electrode formed on the substrate in facing relation with a part of the second beam, and a second intermediate electrode formed on the electrical insulator in facing relation with the second lower electrode.

The present invention still further provides a micro-machine switch electrically connecting a first signal line formed on a substrate to a second signal line or electrically disconnecting the first signal line from the second signal line, the second signal line being formed on the substrate and having an end spaced away from an end of the first signal line by a certain gap, characterized by a supporter formed on the substrate and having a predetermined height relative to a surface of the substrate, a flexible beam projecting from the supporter in parallel with a surface of the substrate, and having a distal end facing the gap, a first electrical insulator having a bottom in a plane in which a bottom of the beam exists, and extending from the beam in a direction in which the beam extends, a contact electrode formed on a surface of the first electrical insulator facing the substrate such that the contact electrode faces the gap, a lower electrode formed on the substrate in facing relation with a part of the beam, an intermediate electrode formed on the beam in facing relation with the lower electrode, and a reinforcement formed on the first electrical insulator at a side opposite to the contact electrode in alignment with the contact electrode.

It is preferable that the first electrical insulator and the beam are composed of the same semiconductor.

It is preferable that the first electrical insulator has a resistance higher than a resistance of the supporter and the beam.

It is preferable that the micro-machine switch further includes a second electrical insulator formed on a lower surface of the beam in facing relation with the lower electrode, in which case, it is preferable that the intermediate electrode is formed on a lower surface of the second electrical insulator.

It is preferable that the second electrical insulator has a thickness smaller than a thickness of the contact electrode.

It is preferable that that micro-machine switch further includes at least one second supporter formed on the substrate, and having a predetermined height relative to a surface of the substrate, in which case, it is preferable that the second supporter being connected to the first electrical insulator through a second beam projecting from the second supporter in parallel with a surface of the substrate.

It is preferable that the micro-machine switch further includes a second lower electrode formed on the substrate in facing relation with a part of the second beam, and a second intermediate electrode formed on the second beam in facing relation with the second lower electrode.

It is preferable that the micro-machine switch further includes a third electrical insulator formed on a lower surface of the second beam in facing relation with the second lower electrode, in which case, it is preferable that the second intermediate electrode is formed on a lower surface of the third electrical insulator.

The present invention yet further provides a micro-machine switch electrically connecting a first signal line formed on a substrate to a second signal line or electrically disconnecting the first signal line from the second signal line, the second signal line being formed on the substrate and having an end spaced away from an end of the first signal line by a certain gap, characterized by a supporter formed on the substrate and having a predetermined height relative to a surface of the substrate, a flexible beam projecting from the supporter in parallel with a surface of the substrate, and having a distal end facing the gap, a first electrical insulator making contact with a lower surface of the beam, and extending from the beam in a direction in which the beam extends, a contact electrode formed on a surface of the first electrical insulator facing the substrate such that the contact electrode faces the gap, a lower electrode formed on the substrate in facing relation with a part of the beam, an intermediate electrode formed on the first electrical insulator in facing relation with the lower electrode, and electrically connected to the beam, and a reinforcement formed on the first electrical insulator at a side opposite to the contact electrode in alignment with the contact electrode.

It is preferable that the first electrical insulator is formed with a hole, which is filled with an electrical conductor through which the intermediate electrode and the beam.

It is preferable that the micro-machine switch further includes a first insulating film which at least partially covers at least one of the intermediate electrode and the lower electrode.

It is preferable that the micro-machine switch further includes a second insulating film which at least partially covers at least one of the contact electrode and the first and second signal lines.

It is preferable that the first insulating film at least partially covers the intermediate electrode, and a sum of thicknesses of the intermediate electrode and the first insulating film is smaller than a thickness of the contact electrode.

It is preferable that the second insulating film at least partially covers the contact electrode, and a sum of thicknesses of the contact electrode and the second insulating film is greater than a thickness of the intermediate electrode.

It is preferable that the lower electrode is formed on the substrate between the supporter and the gap.

For instance, the electrical conductor may be composed of semiconductor.

For instance, the semiconductor may be single crystal semiconductor, amorphous semiconductor or polycrystal semiconductor.

It is preferable that a surface of the supporter and a surface of the beam form an obtuse angle.

It is preferable that the intermediate electrode has a thickness smaller than a thickness of the contact electrode.

It is preferable that at least one of the contact electrode and the first and second signal lines is covered with an insulating film which will make capacity connection.

The substrate may be a glass substrate, a ceramic substrate or a gallium-arsenide (GaAs) substrate.

For instance, the intermediate electrode may be electrically connected to the upper electrode, and the upper electrode may be in an electrically floating condition.

The lower electrode may be comprised of a plurality of electrodes each having the same area by which each of the electrodes faces the upper electrode.

The upper electrode may be comprised of a plurality of electrodes each having the same area by which each of the electrodes faces the lower electrode.

The lower electrode may be comprised of a plurality of electrodes each having the same area by which each of the electrodes faces the upper electrode, and the upper electrode may be comprised of a plurality of electrodes each having the same area by which each of the electrodes faces the lower electrode.

It is preferable that each of the upper and lower electrodes comprised of a plurality of the electrodes defines a comb-shaped electrode.

It is preferable that the supporter and the beam are covered at their surfaces with an insulating film.

It is preferable that the beam is composed of silicon, and the insulating film is comprised of a film formed due to oxidation of a surface of the beam.

It is preferable that a thickness of the insulating film on an upper surface of the beam is equal to a thickness of the insulating film on a lower surface of the beam.

For instance, the beam may be designed to have a super-lattice structure having a multi-layered structure composed of two or more materials.

The above-mentioned micro-machine switch may be applied to a phased-array antenna. Hence, the present invention further provides a phased-array antenna including the above-mentioned micro-machine switch.

Specifically, the present invention provides a phased-array antenna including at least one phase shifter including a micro-machine switch for each of bits, characterized by that the micro-machine switch is a micro-machine switch defined in any one of claims 1 to 24.

In another aspect of the present invention, there is provided a phased-array antenna including M antennas (M is an integer equal to or greater than 2), a data distributing circuit, M data latching circuits each electrically connected to the data distributing circuit, M N-bit phase-shifters each electrically connected to both an associated data latching circuit and an associated antenna (N is a positive integer), a power feeder which feeds electric power to each of the phase-shifters, and a controller electrically connected to each of the data latching circuits and the data distributing circuit, characterized in that each of the phase-shifters includes a micro-machine switch for each of bits, each of the data latching circuits is electrically connected to the micro-machine switch of the associated phase-shifter, the controller calculates with N-bit accuracy a degree of phase-shifting optimal for directing a radiated beam towards a desired direction, based on predetermined location and frequency of the antenna, and transmits the calculation result to each of the data latching circuits through the data distributing circuit, each of the phase-shifters applies a drive voltage to a micro-machine switch associated with a bit required by each of the phase-shifters, determines a degree of phase-shifting of each of the phase-shifters, alters a phase of a radio-frequency signal in accordance with the thus determined degree of phase-shifting, and supplies electric power to each of antennas, the micro-machine switch is comprised of the above-mentioned micro-machine switch.

The present invention further provides a method of fabricating a micro-machine switch.

Specifically, the present invention provides a method of fabricating a micro-machine switch, including the steps of etching a substrate at areas except a first area to thereby turn the first area into a raised portion, diffusing impurities into the first area and a second area of the substrate, which second area is a different area from the first area, diffusing impurities into a third area which connects the first and second areas to each other, forming an electrical insulator on the second area, forming first and second electrodes on the electrical insulator above the second area, forming a third electrode and a pair of signal lines on a second substrate, adhering an upper surface of the first area of the substrate onto the second substrate such that the first electrode faces the pair of signal lines and the second electrode faces the third electrode, and removing areas of the substrate except area into which impurities have been diffused.

The present invention further provides a method of fabricating a micro-machine switch, including the steps of etching a substrate at areas except first and second areas to thereby turn the first and second areas into raised portions, diffusing impurities into the first area, the second area, and a third area of the substrate located between the first and second areas, diffusing impurities into both a fourth area which connects the first and third areas to each other, and a fifth area which connects the second and third areas to each other, forming an electrical insulator on the third area, forming first and second electrodes on the electrical insulator above the third area, forming a third electrode and a pair of signal lines on a second substrate, adhering upper surfaces of the first and second areas of the substrate onto the second substrate such that the first electrode faces the pair of signal lines and the second electrode faces the third electrode, and removing areas of the substrate except area into which impurities have been diffused.

The present invention provides a method of fabricating a micro-machine switch, including the steps of etching a substrate at areas except a first area to thereby turn the first area into a raised portion, diffusing impurities into the first area, a third area, and a second area located between the first and second areas, diffusing impurities into a fourth area which connects the first and second areas to each other, forming an electrical insulator across the second and third areas on the substrate, forming a first electrode on the electrical insulator above the third area, and further forming a second electrode on the electrical insulator above the second area, forming a third electrode and a pair of signal lines on a second substrate, adhering an upper surface of the first area of the substrate onto the second substrate such that the first electrode faces the pair of signal lines and the second electrode faces the third electrode, and removing areas of the substrate except area into which impurities have been diffused.

It is preferable that the method further includes the steps of forming a through-hole through the electrical insulator such that the through-hole reaches the second area, and filling the through-hole with an electrical conductor such that the second electrode is electrically connected to the second area through the electrical conductor.

It is preferable that the method further includes the step of covering the first and second electrodes with an electrical insulator.

The present invention provides a method of fabricating a micro-machine switch, including the steps of etching a substrate at areas except first and second areas to thereby turn the first and second areas into raised portions, diffusing impurities into the first area, the second area, a third area located between the first and second areas, a fourth area located between the second and third areas, and a fifth area located between the second and fourth areas, diffusing impurities into both a sixth area which connects the first and third areas to each other, and a seventh area which connects the second and fifth areas to each other, forming an electrical insulator extending across the third and fifth areas on the substrate, forming a first electrode on the electrical insulator above the third area, forming a second electrode on the electrical insulator above the fourth area, and further forming a third electrode on the electrical insulator above the fifth area, forming a fourth electrode, a fifth substrate and a pair of signal lines on a second substrate, adhering upper surfaces of the first and second areas of the substrate onto the second substrate such that the second electrode faces the pair of signal lines, the first electrode faces the fourth electrode, and the third electrode faces the fifth electrode, and removing areas of the substrate except area into which impurities have been diffused.

It is preferable that the method further includes the steps of forming first and second through-holes through the electrical insulator such that the first through-hole reaches the third area and the second through-hole reaches the fourth area, and filling the first and second through-holes with an electrical conductor such that the first electrode is electrically connected to the third area through the electrical conductor and the second electrode is electrically connected to the fourth area through the electrical conductor.

It is preferable that the method further includes the step of covering the first, second and third electrodes with an electrical insulator.

The present invention provides a method of fabricating a micro-machine switch, including the steps of etching a substrate at areas except a first area to thereby turn the first area into a raised portion, diffusing impurities into the first area, a third area, and a second area located between the first and second areas, diffusing impurities into a fourth area which connects the first and second areas to each other, etching the substrate in a fifth area connecting the second and third areas to each other to thereby form a recess in the fifth area, filling the recess with an electrical insulator, forming an electrical insulator on the second area, forming a first electrode on the electrical insulator above the third area, and further forming a second electrode on the electrical insulator above the second area, forming a third electrode and a pair of signal lines on a second substrate, adhering an upper surface of the first area of the substrate onto the second substrate such that the first electrode faces the pair of signal lines and the second electrode faces the third electrode, and removing areas of the substrate except area into which impurities have been diffused.

The present invention provides a method of fabricating a micro-machine switch, including the steps of etching a substrate at areas except first and second areas to thereby turn the first and second areas into raised portions, diffusing impurities into the first and second areas, a third area located between the first and second areas, a fourth area located between the second and third areas, and a fifth area located between the third and fourth areas, diffusing impurities into both a sixth area which connects the first and third areas to each other a seventh area which connects the second and fourth areas to each other, etching the substrate in an eighth area connecting the third and fourth areas to each other to thereby form a recess in the eighth area, filling the recess with an electrical insulator, forming a first electrical insulator on the third area, and further forming a second electrical insulator on the fourth area, forming a first electrode on the electrical insulator above the fifth area, forming a second electrode on the first electrical insulator above the third area, and further forming a third electrode on the second electrical insulator above the fourth area, forming a fifth electrode and a pair of signal lines on a second substrate, adhering upper surfaces of the first and second areas of the substrate onto the second substrate such that the first electrode faces the pair of signal lines, the second electrode faces the fourth electrode, and the third electrode faces the fifth electrode, and removing areas of the substrate except area into which impurities have been diffused.

For instance, if the substrate is composed of silicon and the second substrate is composed of glass, it is preferable that the substrate and the second substrate are electrostatically coupled to each other.

If the second substrate is composed of ceramic or gallium-arsenide (GaAs), it is preferable that the substrate and the second substrate are adhered to each other through an adhesive.

If the second substrate is composed of ceramics or gallium-arsenide (GaAs), it is preferable that the method further includes the step of forming a thin glass film on the second substrate, and that the substrate and the second substrate are electrostatically coupled to each other.

The step of removing areas of the substrate may include the step of dipping the substrate into an etching solution having a characteristic of selecting a concentration of the impurities, to thereby solve areas into which the impurities have not been diffused.

The advantages obtained by the aforementioned present invention will be described hereinbelow.

As mentioned above, the present invention lowers a voltage for driving a switch, by forming an intermediate electrode to thereby shorten a distance between an upper electrode and a lower electrode.

For instance, it is assumed that an intermediate electrode having the same thickness as a thickness of a contact electrode is formed on an upper electrode with an insulating film being sandwiched therebetween, and that the intermediate electrode is not directly electrically connected to an external voltage circuit.

When a voltage V is applied across the upper and lower electrodes, a voltage of the intermediate electrode is calculated in accordance with the following equation.

$$V \cdot C_1/(C_1+C_2)$$

$C_1$ indicates an electrostatic capacity between the intermediate and upper electrodes, and $C_2$ indicates an electrostatic capacity between the intermediate and lower electrodes. Since $C_1$ is greater than $C_2$, the intermediate and upper electrodes have almost the same voltage.

Comparing the intermediate electrode to the conventional micro-machine switch illustrated in FIGS. 1A and 1B, a distance between the intermediate and lower electrodes is equal to 4 μm, that is, a distance between the contact electrode and the signal lines. Namely, since a distance between the electrodes across which a voltage is applied is reduced down to ⅔ (=4 μm/6 μm), a requisite voltage is also reduced down to about 67V (100×⅔). The present invention makes it possible to reduce an applied voltage down to ⅔ of a voltage required in the conventional micro-machine switch.

In addition, since the intermediate electrode can be fabricated together with the contact electrode, the intermediate electrode can be fabricated without any increase in fabrication costs of a device.

As detailed in the later mentioned embodiments, the intermediate electrode may be designed to have various structures.

As mentioned so far, the present invention makes it possible to operate a micro-machine switch at a voltage lower than a voltage at which a conventional micro-machine switch operates, and to enhance a breakdown voltage of an insulating film to thereby improve device performances.

As having been explained so far, the intermediate electrode is formed between the lower electrode and the upper electrode in the micro-machine switch in accordance with the present invention. The intermediate electrode reduces a voltage applied for driving a switch.

For instance, if a gap of 4 μm is formed between the contact electrode and the signal lines, a voltage to be applied across the upper and lower electrodes can be reduced down to about ⅔ of a voltage to be applied in the conventional micro-machine switch. If a distance between the contact electrode and the signal lines is set equal to or smaller than 4 μm, it would be possible to further reduce a voltage to be applied across the upper and lower electrodes. Specifically, the voltage can be reduced down to about ⅔ or smaller of a voltage to be applied in the conventional micro-machine switch.

Since the intermediate electrode can be formed simultaneously with the conventional contact electrode, it would be not necessary to add extra steps to a method of fabricating the micro-machine switch in accordance with the invention, preventing an increase in fabrication costs.

In addition, since a voltage to be applied across the upper and lower electrodes can be reduced, as mentioned earlier, it would be possible to prevent a high voltage from being applied to the electrically insulating film formed between the upper and lower electrodes. This makes it no longer necessary to form a qualified electrically insulating film, widening selection in processes of fabricating the micro-machine switch. Accordingly, it would be possible to prevent destruction of the switch caused by limitation in a breakdown voltage in the electrically insulating film.

A voltage required for driving an external driver circuit can be also reduced, ensuring simplification of the external driver circuit and reduction in power consumption.

When the lower electrode is divided into two or more electrodes, a higher voltage would have to be applied to the lower electrode, in comparison with one lower electrode having an area equal to a total of areas of the divided electrodes. However, since a voltage is not applied to the electrically insulating film in the divided electrodes, it would be possible to prevent occurrence of dielectric breakdown, even if the electrically insulating film had a poor quality. An increase in an applied voltage can be compensated for by an increase in a size of the switch. Hence, the lower electrode can be divided into two or more electrodes, if it is not always necessary to reduce a size of the micro-machine switch.

Above all, since it is no longer necessary for the micro-machine switch to have an upper electrode and the micro-machine switch can be operated merely by applying a voltage to the lower electrode, there is obtained an advantage that wire arrangement in the micro-machine switch can be simplified. Hence, it is possible to significantly improve shortcomings such as an increase in fabrication costs due to complicated wire arrangement, a complicated structure of the switch and reduction in long-term reliability.

Since the method of fabricating a micro-machine switch, in accordance with the present invention, can be carried out at a high temperature, following advantages are obtained.

First, a material of which the beam is composed can be selected from a wide range of materials. Various electrical conductors and semiconductors can be selected. Thus, designability in selecting materials is enhanced.

Secondly, since the electrically insulating film fabricated at a high temperature has a high breakdown voltage, the resultant micro-machine switch could have enhanced electrical characteristics.

Thirdly, since designability in a thickness-wise direction is enhanced, it would be possible to reduce a width of the beam, ensuring reduction in a size of the micro-machine switch.

By virtue of the above-mentioned advantages, the micro-machine switch in accordance with the present invention can be applied not only to an individually used conventional switch, but also to a phased-array antenna which is required to integrate switches on a wide-area substrate in an order to ten thousands.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

[First Embodiment]

Figure 2A:
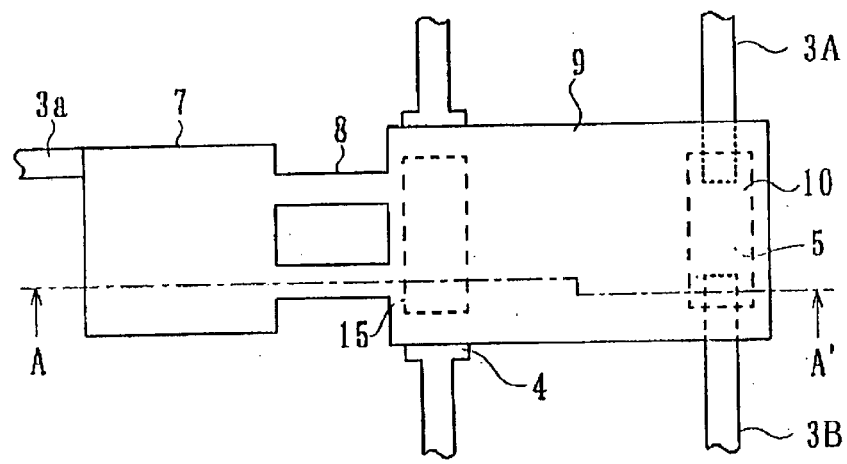
FIG. 2A is a plan view of a micro-machine switch in accordance with the first embodiment of the present invention.
Figure 2B:
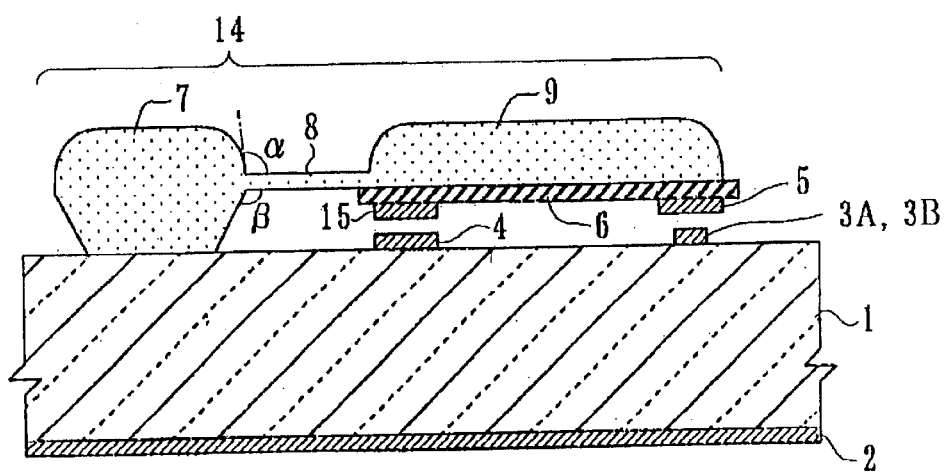
FIG. 2B is a cross-sectional view taken along the line A–A' in FIG. 2A.

FIG. 2A is a plan view of a micro-machine switch in accordance with the first embodiment of the present invention, and FIG. 2B is a cross-sectional view taken along the line A–A' in FIG. 2A.

As illustrated, a switch 14 composed of silicon, a lower electrode 4 composed of gold, and a pair of signal lines 3A and 3B both composed of gold are formed on a glass substrate 1 having a high dielectric constant. An earth plate 2 is formed on a lower surface of the substrate 1.

The switch 14 is comprised of a supporter 7, a cantilever 8 extending from the supporter 7, and an upper electrode 9 connected to the cantilever 8 at a distal end of the cantilever 8, all of which are integral with one another.

Figure 1A:
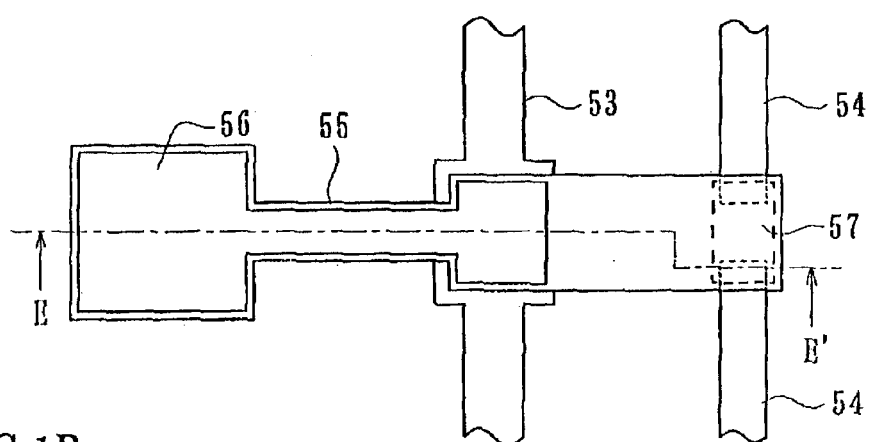
FIG. 1A is a plan view of a conventional micro-machine switch
Figure 1B:
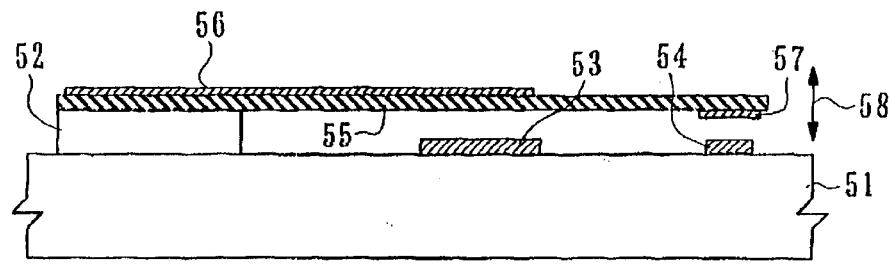
FIG. 1B is a cross-sectional view taken along the line E–E' in FIG. 1A.

Two cantilevers 8 composed of silicon extend from the supporter 7 in parallel with a surface of the substrate. The two cantilevers 8 can reduce rotation thereof to thereby make it possible to prevent partial contact of a switch, in comparison with the single cantilever 55 (see FIGS. 1A and 1B) in the conventional micro-machine switch.

The number of the cantilevers 8 is determined in accordance with whole conditions, and is not to be limited to two. The micro-machine switch may include one or two or more cantilevers 8.

In the first embodiment, the supporter 7 and the cantilevers 8 are designed such that angles $\alpha$ and $\beta$ formed by the supporter 7 and the cantilevers 8 at a connection of them make obtuse angles ($90°<\alpha$, $\beta<180°$). By setting the angles $\alpha$ and $\beta$ to make obtuse angles, it would be possible to increase a strength of the cantilevers 8, and carry out switching to an alternating current having a frequency equal to or greater than 1 MHz.

The upper electrode 9 composed of silicon is connected to the cantilevers 8 at distal ends of the cantilevers 8. The upper electrode 9 faces the lower electrode 4 with a spatial gap existing therebetween.

The supporter 7 is electrically connected to a signal line 3a formed on the substrate 1. The signal line 3a is electrically connected to the upper electrode 9 through the supporter 7 and the cantilevers 8.

An electrical insulator 6 comprised of a silicon dioxide film, a silicon nitride film or other electrically insulating films is formed on a lower surface of the upper electrode 9, extending across the lower electrode 4 and the signal lines 3A and 3B.

A contact electrode 5 composed of gold is formed on a lower surface of the electrical insulator 6 in facing relation with the signal lines 3A and 3B. An intermediate electrode 15 is formed on a lower surface of the electrical insulator 6 in facing relation with the lower electrode 4.

The electrical insulator 6 prevents the contact electrode 5 and the upper electrode 9 from short-circuited each other. In the first embodiment, though the electrical insulator 6 is designed to extend across the intermediate electrode 15 and the contact electrode 5, the electrical insulator 6 may be formed only between the contact electrode 5 and the upper electrode 9 and between the intermediate electrode 15 and the upper electrode 9.

When a radio-frequency signal is to be switched, it is preferable that the contact electrode 5 is covered with an electrically insulating film as long as the contact electrode 6 can make capacity coupling with the signal lines 3A and 3B. As an alternative, the signal lines 3A and 3B in place of the contact electrode 5 may be covered with an electrically insulating film. As an alternative, both the signal lines 3A and 3B and the contact electrode 5 may be covered with an electrically insulating film.

As mentioned above, since the upper electrode 9 having a greater thickness than a thickness of the cantilever 8 is formed on the electrical insulator 6 facing the contact electrode 6, it would be possible to reduce curvature of the contact electrode 5 caused by a strain generated between the contact electrode 5 and the electrical insulator 6. Accordingly, the contact electrode 5 can keep parallel with the substrate 1, preventing an increase in a contact resistance caused by partial contact of the contact electrode 5.

An operation of the micro-machine switch in accordance with the first embodiment is explained hereinbelow.

When a voltage of 70V is applied across the upper electrode 9 and the lower electrode 4 through the signal line 3a, an electrostatic force is exerted on the upper electrode 9 as an attractive force downwardly towards the substrate 1. As a result, the cantilevers 8 are downwardly bent around the supporter 7, and then, the contact electrode 5 makes contact with the signal lines 3A and 3B.

As illustrated in FIG. 2A, a gap is formed between the signal lines 3A and 3B in alignment with the contact electrode 5. Thus, when a voltage is not applied across the upper electrode 9 and the lower electrode 4, a current does not run through the signal lines 3A and 3B. In contrast, when a voltage is applied across the upper electrode 9 and the lower electrode 4, and resultingly, the contact electrode 5 makes contact with the signal lines 3A and 3B, a current runs through the signal lines 3A and 3B.

As mentioned above, it is possible to control on/off of a current or signal running through the signal lines 3A and 3B, by applying a voltage or stopping application of a voltage across the upper electrode 9 and the lower electrode 4.

The results of the experiments having been conducted by the inventors show that when a signal having a frequency of 30 GHz was switched by a conventional HEMT (High Electron Mobility Transistor) switch, an insertion loss was 3 to 4 dB, whereas when the same signal was switched by the micro-machine switch in accordance with the first embodiment, an insertion loss was 2.5 dB.

As mentioned above, in accordance with the first embodiment, since the upper electrode 9 is electrically connected to the supporter 7 composed of an electrically conductive material, through the cantilever 8 composed of an electrically conductive material, a voltage could be readily applied to the upper electrode 9.

The upper electrode 9 may be designed to be electrically floating, in which case, it is no longer necessary to form the signal line 3a. What has to do in order to operate the micro-machine switch in accordance with the first embodiment is just to apply a voltage to the lower electrode 4.

The supporter 7, the cantilevers 8 and the upper electrode 9 may be composed of semiconductor material into which impurity is partially or entirely diffused, in which case, since quite a small current runs across the upper electrode 9 and the lower electrode 4 during an operation of the micro-machine switch, it would not be necessary to accurately control a content of impurity in semiconductor material.

As explained in a later mentioned method of fabricating a micro-machine switch, the cantilever 8 could be readily formed to have a smaller thickness than thicknesses of other parts. By controlling a thickness of individual parts of the micro-machine switch, it would be possible to fabricate the cantilever 8 having flexibility, among parts having high stiffness. Accordingly, parts having high stiffness are deformed in a plane in parallel with the substrate 1 on application of a voltage, and almost all deformation in a vertical direction is made in the thin cantilevers 8. This reduces partial contact of the contact electrode 5 with the signal lines 3A and 3B.

The upper electrode 9 may be designed to have a thickness equal to a thickness of the cantilevers 8. By equalizing thicknesses of the upper electrode and the cantilevers to each other, a process of fabricating the switch 14 could be simplified.

Table 1 shows typical dimensions of the parts constituting the micro-machine switch in accordance with the first embodiment.

TABLE 1

|  | Width | Length | Thickness |
| --- | --- | --- | --- |
| Cantilever 8 | 10 μm | 130 μm | 3 μm |
| Upper electrode 9 | 100 μm | 200 μm | 10 μm |
| Contact electrode 5 | 70 μm | 10 μm | 2 μm |
| Intermediate electrode 15 | 90 μm | 40 μm | 2 μm |

In Table 1, "width" means a length measured in a longitudinal direction in FIG. 2A, "length" means a length measured in a transverse direction in FIG. 2A, and "thickness" means a length measured in a longitudinal direction in FIG. 2B.

A distance between the intermediate electrode 15 and the lower electrode 4 is set equal to 4 μm.

However, it should be noted that dimensions of the parts should be determined in accordance with specification of those parts, and are not to be limited to the dimensions shown in Table 1.

In accordance with the first embodiment, it would be possible to design a micro-machine switch in a wide range because of its enhanced designability For instance, if the intermediate electrode 15 is designed to have a thickness slightly smaller than a thickness of the contact electrode 5, a contact force between the contact electrode 5 and the signal lines 3A and 3B would be increased, and a contact resistance between them would be decreased. This is in particular suitable to a switch turning on or off a DC signal.

If the intermediate electrode 15 is designed to have a thickness slightly greater than a thickness of the contact electrode 5, the contact electrode 5 would not make direct contact with the signal lines 3A and 3B, even when the switch is on.

When the micro-machine switch is to be applied to a radio-frequency signal, a signal can be transmitted through capacity contact in place of resistance contact. Hence, it is not always necessary for the contact electrode 5 to make direct contact with the signal lines 3A and 3B. By designing the contact electrode 5 not to make direct contact with the signal lines 3A and 3B, it would-be possible to reduce mechanical abrasion of the contact electrode 5 and the signal lines 3A and 3B, ensuring long lifetime of the micro-machine switch.

The above-mentioned micro-machine switch is operated by applying a voltage across the supporter 7 electrically connected to the upper electrode 9 and the lower electrode 4, however, it should be noted that it is not always necessary to fix a voltage of the supporter 7. The micro-machine switch can be operated by applying a voltage only to the lower electrode 4.

The supporter 7 (that is, the upper electrode 9) has not a fixed voltage, but a floating voltage, in which case, the upper electrode 9 would have a voltage influenced by surrounding voltages, and it would be possible to almost equalize a voltage of the supporter 7 to a ground voltage, by arranging ground lines around the supporter 7. Such ground lines are arranged generally in the vicinity of the switch 14.

When the supporter 7 is designed to have a floating potential, it would be not necessary to form a line to be electrically connected to the supporter 7, ensuring simplification in arrangement of lines in the micro-machine switch.

Hereinbelow is explained a method of fabricating the micro-machine switch in accordance with the first embodiment, illustrated in FIGS. 2A and 2B.

FIGS. 3A–3G are cross-sectional views illustrating respective steps of a method of fabricating the micromachine switch in accordance with the first embodiment, illustrated in FIGS. 2A and 2B. Hereinbelow are explained steps in the method.

Figure 3A:
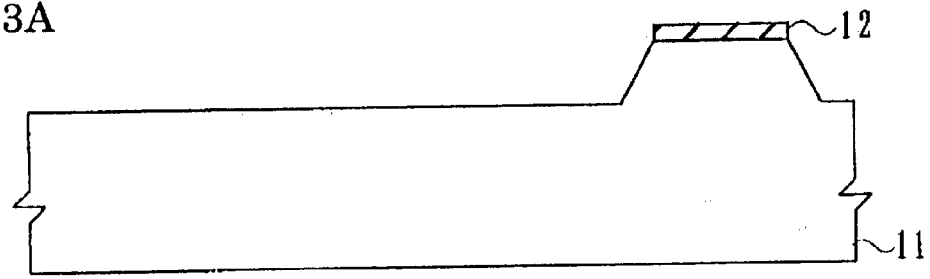
FIGS. 3A to 3G are cross-sectional views showing respective steps of a method of fabricating the micro-machine switch in accordance with the first embodiment, illustrated in FIGS. 2A and 2B.

First, as illustrated in FIG. 3A, a pattern 12 composed of silicon dioxide is formed on a silicon substrate 11. Then, the silicon substrate 11 is etched by about 6 $\mu$m through the use of tetramethylammonium hydroxide (TMAH) as an etchant.

When the silicon substrate 11 is comprised of a silicon substrate having (100) plane as a principal plane, a trapezoidal projection is formed after etching due to dependency of an etching rate on plane azimuth. The trapezoidal projection has (111) plane as an exposed sidewall.

Figure 3B:
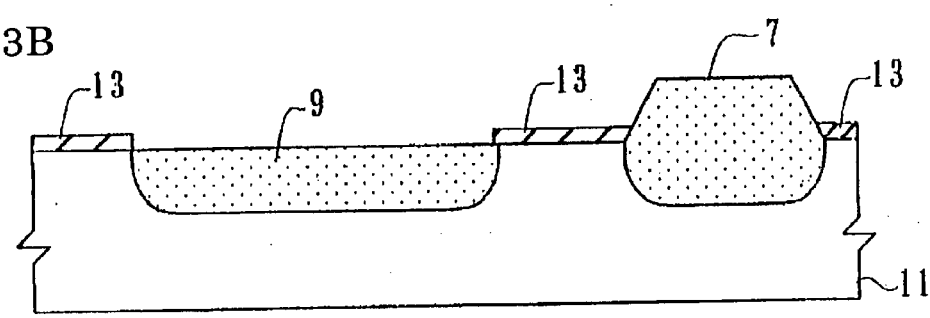

Then, as illustrated in FIG. 3B, a pattern 13 is newly formed on the silicon substrate 11. Then, boron is diffused into non-masked area with the pattern 13 being used as a mask. Thereafter, the silicon substrate is thermally annealed, for instance, at 1150 degrees centigrade for 10 hours, in order to diffuse boron deeply. As a result, boron is diffused into the silicon substrate at a depth of about 10 $\mu$m at a high concentration. Thus, there are formed the supporter 7 and the upper electrode 9.

Figure 3C:
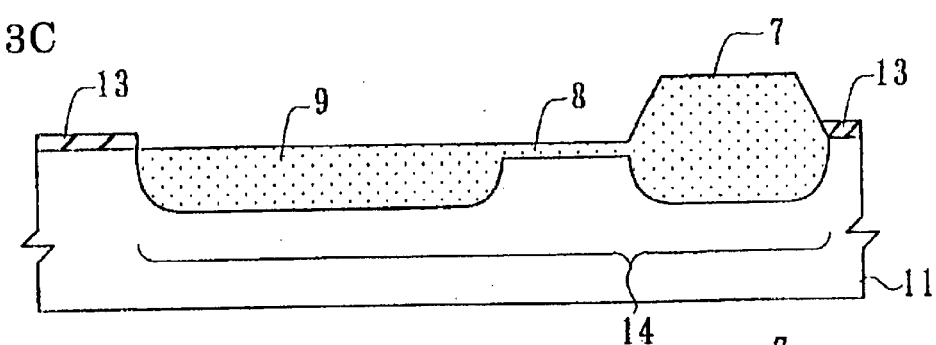

Then, as illustrated in FIG. 3C, the pattern 13 is removed in an area corresponding to the cantilevers 8. Then, boron is diffused into the silicon substrate 11 in non-masked area with the rest of the pattern 13 being used as a mask. Thus, there is fabricated the switch 14 comprised of the supporter 7, the cantilevers 8 and the upper electrode 9.

The silicon substrate is thermally annealed, for instance, at 1150 degrees centigrade for 2 hours, in order to diffuse boron shallowly. As a result, boron is diffused into the silicon substrate at a depth of about 2 $\mu$m at a high concentration.

Figure 3D:
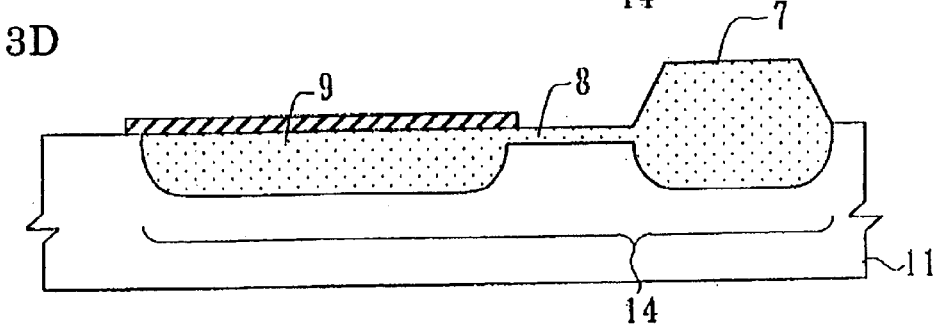

Then, as illustrated in FIG. 3D, the electrical insulator 6 comprised of a 1 $\mu$m-thick silicon dioxide film and a 0.05 $\mu$m-thick nitride film is formed on the silicon substrate 11 such that the electrical insulator 6 covers the upper electrode 9 therewith.

Figure 3E:
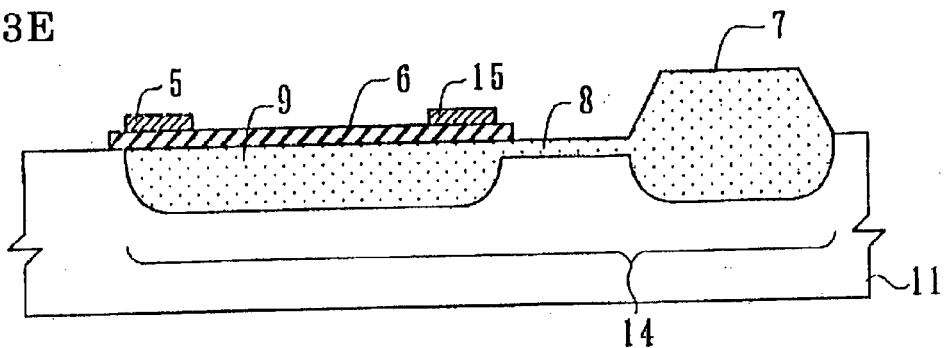

Then, as illustrated in FIG. 3E, the contact electrode 5 and the intermediate electrode 15 are formed on the electrical insulator 6 by gold plating. The contact electrode 5 and the intermediate electrode 15 are positioned above the upper electrode 9.

Figure 3F:
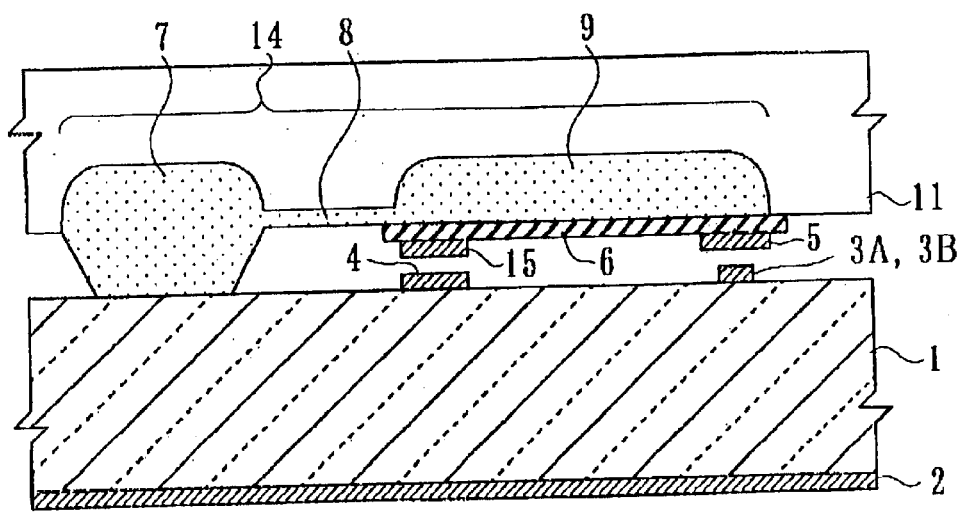

Then, as illustrated in FIG. 3F, there is in advance fabricated a glass substrate 1 separately from the substrate 11. The lower electrode 4 composed of gold and the signal lines 3A, 3B and 3a all composed of gold are formed on the glass substrate 1. The substrate 11 having been fabricated in accordance with the steps illustrated in FIGS. 2(a) to 3(e) is turned upside down, and is put on the glass substrate 1.

Thereafter, the supporter 7 is adhered to the glass substrate 1. The supporter 7 composed of silicon and the glass substrate 1 may be adhered to each other by electrostatic coupling.

Figure 3G:
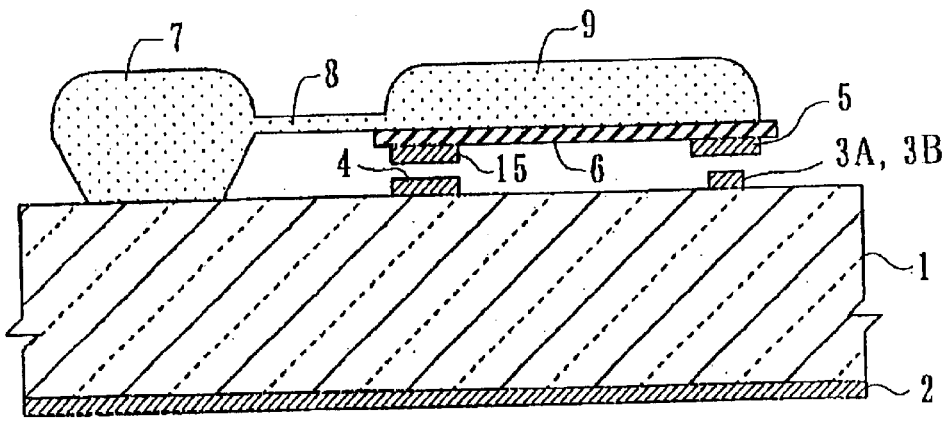

Then, as illustrated in FIG. 3G, the substrate 11 is dipped into an etching solution having a characteristic of selection to a boron concentration, such as ethylenediaminepyrocatechol, to thereby dissolve portions into which no boron is diffused. As a result, only the supporter 7, the cantilever 8 and the upper electrode 9 remain on the glass substrate 1. Thus, there is completed the micro-machine switch as illustrated in FIGS. 2A and 2B.

When the substrate 1 is composed of ceramics or gallium arsenide, the supporter may be adhered to the substrate 1 through an adhesive. As an alternative, the supporter 7 may be adhered to the substrate 1 by electrostatic coupling, if a glass layer having a thickness in the range of 2 $\mu$m to 5 $\mu$m is in advance formed on the substrate 1 by sputtering.

As mentioned above, in the first embodiment, the switch 14 comprised of the supporter 7, the cantilevers 8 and the upper electrode 9 is formed by etching the single crystal silicon substrate 11. The first embodiment provides an advantage that the switch 14 could have highest reliability in its mechanical characteristic by composing the switch of single crystal material.

Since the cantilevers 8 are composed of single crystal material, curvature would not be generated due to a coefficient of thermal expansion, in comparison with the cantilever which is fabricated by layering a plurality of materials, in the conventional micro-machine switch. That is, since variation in a coefficient of thermal expansion of the cantilever 8 in a direction perpendicular to the substrate 1 at the side closer to the substrate is designed symmetrical with the same at the side remoter from the substrate, curvature in the cantilever 8 is suppressed.

The micro-machine switch in accordance with the first embodiment may be fabricated in accordance with methods other than the above-mentioned one. For instance, a micro-machine switch having the same structure as that of the micro-machine switch in accordance with the first embodiment may be fabricated by forming a plurality of thin films on the substrate 1, and etching them in selected areas.

The switch 14 may be composed of amorphous silicon, polysilicon or highly resistive semiconductor such as GaAs or InP into which iron is doped, in place of single crystal silicon.

As an alternative, the switch 14 may be formed not of semiconductor, but of a metal such as gold or aluminum.

[Second Embodiment]

A micro-machine switch in accordance with the second embodiment is explained hereinbelow with reference to drawings.

Figure 4A:
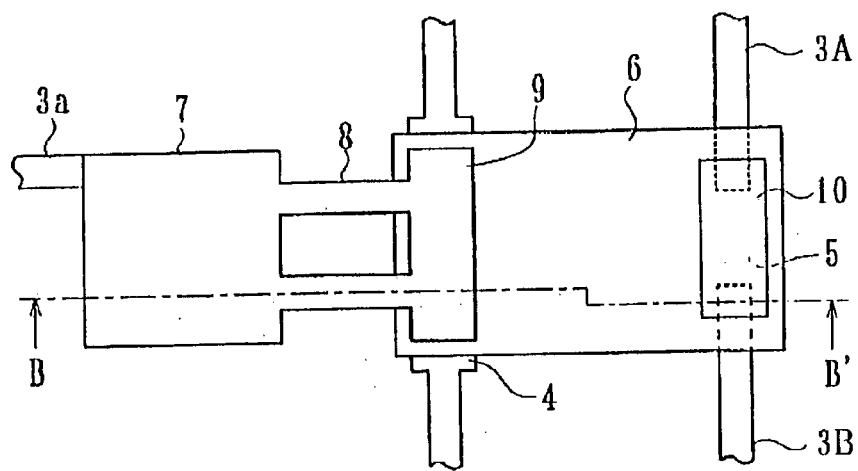
FIG. 4A is a plan view of a micro-machine switch in accordance with the second embodiment of the present invention.
Figure 4B:
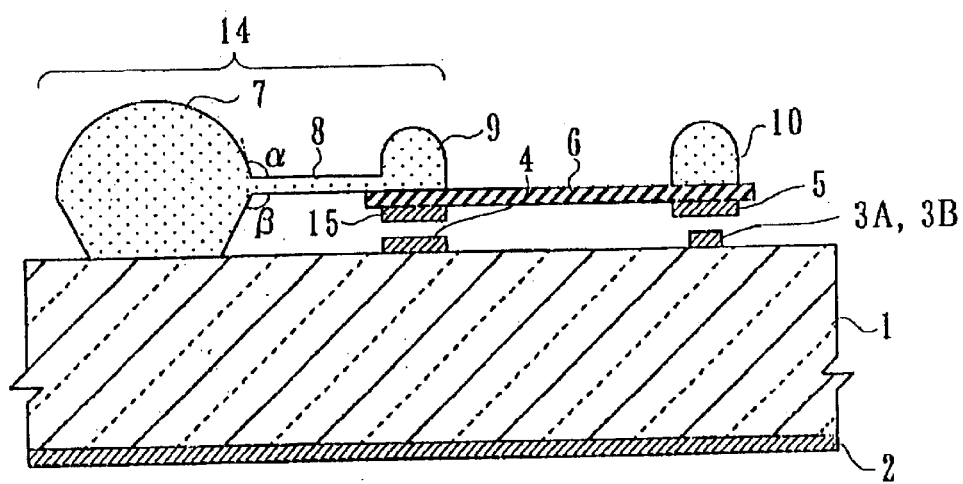
FIG. 4B is a cross-sectional view taken along the line B–B' in FIG. 4A.

FIG. 4A is a plan view of a micro-machine switch in accordance with the second embodiment of the present invention, and FIG. 4B is a cross-sectional view taken along the line B–B' in FIG. 4A.

As illustrated, a supporter 7 composed of silicon, a lower electrode 4 composed of gold, and a pair of signal lines 3A and 3B both composed of gold are formed on a glass substrate 1 having a high dielectric constant, in the micro-machine switch in accordance with the second embodiment. An earth plate 2 is formed on a lower surface of the substrate 1.

The switch 14 is comprised of the supporter 7, a cantilever 8 extending from the supporter 7, and an upper electrode 9 connected to the cantilever 8 at a distal end of the cantilever 8, all of which are integral with one another.

Two cantilevers 8 composed of silicon extend from the supporter 7 in parallel with a surface of the substrate. The number of the cantilevers 8 is determined in accordance with whole conditions, and the micro-machine switch may include one or two or more cantilevers 8, similarly to the first embodiment.

The supporter 7 and the cantilevers 8 are designed such that angles $\alpha$ and $\beta$ formed by the supporter 7 and the cantilevers 8 at a connection of them make obtuse angles (90°<$\alpha$, $\beta$<180°). By setting the angles $\alpha$ and $\beta$ to make obtuse angles, it would be possible to increase a strength of the cantilevers 8, and carry out switching to an alternating current having a frequency equal to or greater than 1 MHz.

The upper electrode 9 composed of silicon is connected to the cantilevers 8 at distal ends of the cantilevers 8. The upper electrode 9 faces the lower electrode 4 with a spatial gap existing therebetween.

The supporter 7 is electrically connected to a signal line 3a formed on the substrate 1. The signal line 3a is electrically connected to the upper electrode 9 through the supporter 7 and the cantilevers 8.

An electrical insulator 6 comprised of a silicon dioxide film, a silicon nitride film or other electrically insulating films is formed on a lower surface of the upper electrode 9, extending across the upper electrode 9 and the signal lines 3A and 3B.

A contact electrode 5 composed of gold is formed on a lower surface of the electrical insulator 6 in facing relation with the signal lines 3A and 3B.

An intermediate electrode 15 is formed on a lower surface of the electrical insulator 6 in facing relation with the lower electrode 4.

When a radio-frequency signal is to be switched, the contact electrode 5 may be covered with an electrically insulating film as long as the contact electrode 5 can make capacity coupling with the signal lines 3A and 3B. As an alternative, the signal lines 3A and 3B in place of the contact electrode 5 may be covered with an electrically insulating film. As an alternative, both the signal lines 3A and 3B and the contact electrode 5 may be covered with an electrically insulating film.

A reinforcement 10 composed of silicon is formed on the electrical insulator 6 in facing relation with the contact electrode 5. The reinforcement 10 reduces curvature of the electrical insulator 6 caused by a strain to be generated between the contact electrode 5 and the electrical insulator 6. The reinforcement 10 keeps the contact electrode 5 in parallel with the substrate 1, and hence, it is possible to prevent an increase in a contact resistance caused by a partial contact of the contact electrode 5 to the signal lines 3A and 3B.

It is not always necessary for the micro-machine switch to have the reinforcement 10. The reinforcement 10 may be unnecessary to be formed in dependence on a material of which the electrical insulator 6 is composed and/or a thickness of the electrical insulator 6.

An operation of the micro-machine switch in accordance with the second embodiment is explained hereinbelow.

When a voltage of 30V is applied across the upper electrode 9 and the lower electrode 4, an electrostatic force is exerted on the upper electrode 9 as an attractive force downwardly towards the substrate 1. As a result, the cantilevers 8 are downwardly bent around the supporter 7, and then, the contact electrode 5 makes contact with the signal lines 3A and 3B.

As illustrated in FIG. 4A, a gap is formed between the signal lines 3A and 3B in alignment with the contact electrode 5. Thus, when a voltage is not applied across the upper electrode 9 and the lower electrode 4, a current does not run through the signal lines 3A and 3B. In contrast, when a voltage is applied across the upper electrode 9 and the lower electrode 4, and resultingly, the contact electrode 5 makes contact with the signal lines 3A and 3B, a current runs through the signal lines 3A and 3B.

As mentioned above, it is possible to control on/off of a current or signal running through the signal lines 3A and 3B, by applying a voltage or stopping application of a voltage to the lower electrode 4.

The results of the experiments having been conducted by the inventors show that when a signal having a frequency of 30 GHz was switched by a conventional HEMT switch, an insertion loss was 3 to 4 dB, whereas when the same signal was switched by the micro-machine switch in accordance with the second embodiment, an insertion loss was 0.2 dB.

As mentioned above, in accordance with the second embodiment, since the upper electrode 9 is electrically connected to the supporter 7 composed of an electrically conductive material, through the cantilever 8 composed of an electrically conductive material, a voltage could be readily applied to the upper electrode 9.

The upper electrode 9 may be designed to be electrically floating, in which case, it is no longer necessary to form the signal line 3a. What has to do in order to operate the micro-machine switch in accordance with the second embodiment is just to apply a voltage to the lower electrode 4.

The supporter 7, the cantilever 8, the upper electrode 9 and the reinforcement 10 may be composed of semiconductor material into which impurity is partially or entirely diffused, in which case, since quite a small current runs across the upper electrode 9 and the lower electrode 4 during an operation of the micro-machine switch, it would not be necessary to accurately control a content of impurity in semiconductor material.

As explained in a later mentioned method of fabricating a micro-machine switch, the cantilever 8 could be readily formed to have a smaller thickness than thicknesses of other parts. By controlling a thickness of individual parts of the micro-machine switch, it would be possible to fabricate the cantilever 8 having flexibility, among parts having high stiffness.

Accordingly, parts having high stiffness are deformed in a plane in parallel with the substrate 1 on application of a voltage, and almost all deformation in a vertical direction is made in the thin cantilevers 8. This reduces partial contact of the contact electrode 5 with the signal lines 3A and 3B.

The upper electrode 9 may be designed to have a thickness equal to a thickness of the cantilevers 8. By equalizing thicknesses of the upper electrode and the cantilevers to each other, a process of fabricating the switch 14 could be simplified.

Table 2 shows typical dimensions of the parts constituting the micro-machine switch in accordance with the second embodiment.

TABLE 2

| | Width | Length | Thickness |
|---|---|---|---|
| Cantilever 8 | 10 μm | 130 μm | 3 μm |
| Upper electrode 9 | 100 μm | 50 μm | 10 μm |
| Contact electrode 5 | 70 μm | 10 μm | 2 μm |
| Intermediate electrode 15 | 90 μm | 40 μm | 2 μm |

In Table 2, "width" means a length measured in a longitudinal direction in FIG. 4A, "length" means a length measured in a transverse direction in FIG. 4A, and "thickness" means a length measured in a longitudinal direction in FIG. 4B.

A distance between the intermediate electrode 15 and the lower electrode 4 is set equal to 4 μm.

However, it should be noted that dimensions of the parts should be determined in accordance with specification of those parts, and are not to be limited to the dimensions shown in Table 2.

In accordance with the second embodiment, it would be possible to design a micro-machine switch in a wide range because of its enhanced designability. For instance, if the intermediate electrode 15 is designed to have a thickness slightly smaller than a thickness of the contact electrode 5, a contact force between the contact electrode 5 and the signal lines 3A and 3B would be increased, and a contact resistance between them would be decreased. This is in particular suitable to a switch turning on or off a DC signal.

If the intermediate electrode 15 is designed to have a thickness slightly greater than a thickness of the contact electrode 5, the contact electrode 5 would not make direct contact with the signal lines 3A and 3B, even when the switch is on.

When the micro-machine switch is to be applied to a radio-frequency signal, a signal can be transmitted through capacity contact in place of resistance contact. Hence, it is not always necessary for the contact electrode 5 to make direct contact with the signal lines 3A and 3B. By designing the contact electrode 5 not to make direct contact with the signal lines 3A and 3B, it would be possible to reduce mechanical abrasion of the contact electrode 5 and the signal lines 3A and 3B, ensuring long lifetime of the micro-machine switch.

The above-mentioned micro-machine switch is operated by applying a voltage across the supporter 7 electrically connected to the upper electrode 9 and the lower electrode 4, however, it should be noted that it is not always necessary to fix a voltage of the supporter 7. The micro-machine switch can be operated by applying a voltage only to the lower electrode 4.

The supporter 7 (that is, the upper electrode 9) has not a fixed voltage, but a floating voltage, in which case, the upper electrode 9 would have a voltage influenced by surrounding voltages, and it would be possible to almost equalize a voltage of the supporter 7 to a ground voltage, by arranging ground lines around the supporter 7. Such ground lines are arranged generally in the vicinity of the switch 14.

When the supporter 7 is designed to have a floating potential, it would be not necessary to form a line to be electrically connected to the supporter 7, ensuring simplification in arrangement of lines in the micro-machine switch.

Hereinbelow is explained a method of fabricating the micro-machine switch in accordance with the second embodiment, illustrated in FIGS. 4A and 4B.

FIGS. 5 and 6 are cross-sectional views illustrating respective steps of a method of fabricating the micro-machine switch in accordance with the second embodiment, illustrated in FIGS. 4A and 4B. Hereinbelow are explained steps in the method.

Figure 5A:
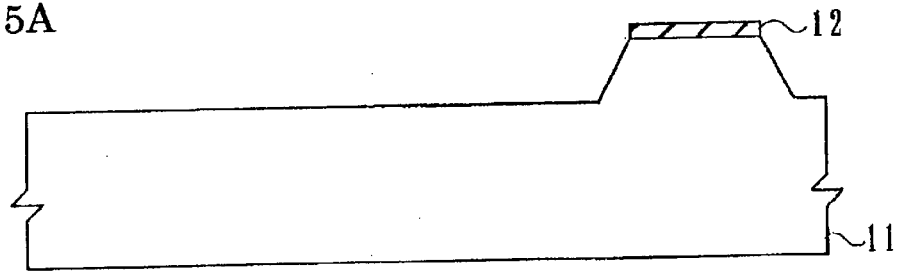
FIGS. 5A to 5G are cross-sectional views showing respective steps of a method of fabricating the micro-machine switch in accordance with the second embodiment, illustrated in FIGS. 4A and 4B.

First, as illustrated in FIG. 5A, a pattern 12 composed of silicon dioxide is formed on a silicon substrate 11. Then, the silicon substrate 11 is etched by about 6 $\mu$m through the use of tetramethylammonium hydroxide (TMAH) as an etchant.

When the silicon substrate 11 is comprised of a silicon substrate having (100) plane as a principal plane, a trapezoidal projection is formed after etching due to dependency of an etching rate on plane azimuth. The trapezoidal projection has (111) plane as an exposed sidewall.

Figure 5B:
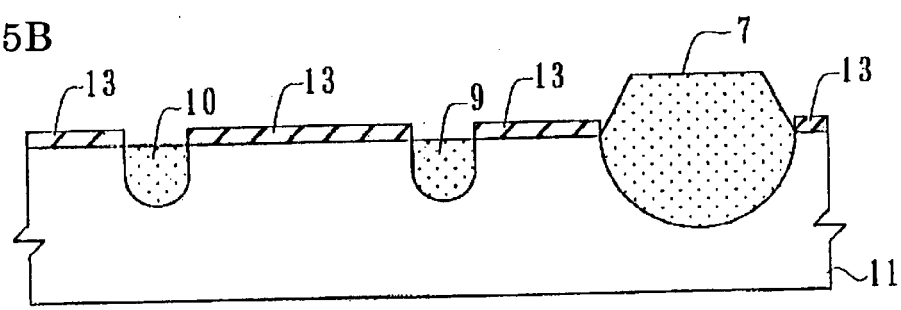

Then, as illustrated in FIG. 5B, a pattern 13 is newly formed on the silicon substrate 11. Then, boron is diffused into non-masked area with the pattern 13 being used as a mask. Thereafter, the silicon substrate is thermally annealed, for instance, at 1150 degrees centigrade for 10 hours, in order to diffuse boron deeply. As a result, boron is diffused into the silicon substrate at a depth of about 10 $\mu$m at a high concentration. Thus, there are formed the supporter 7, the upper-electrode 9, and the reinforcement 10.

Figure 5C:
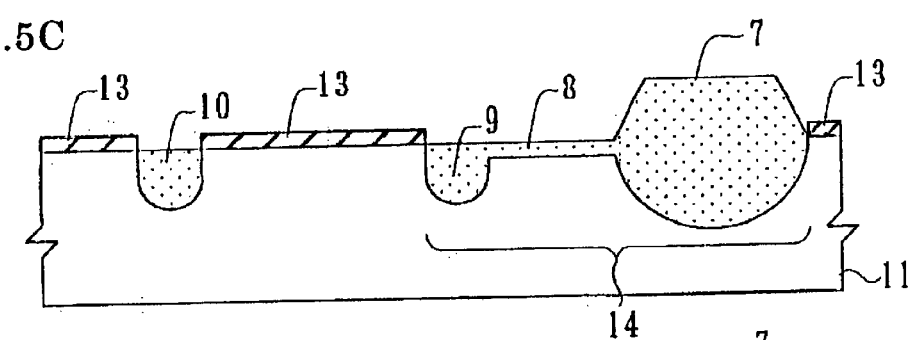

Then, as illustrated in FIG. 5C, the pattern 13 is removed in an area corresponding to the cantilevers 8. Then, boron is diffused into the silicon substrate 11 in non-masked area with the rest of the pattern 13 being used as a mask. Thus, there is fabricated the switch 14 comprised of the supporter 7, the cantilevers 8 and the upper electrode 9.

The silicon substrate is thermally annealed, for instance, at 1150 degrees centigrade for 2 hours, in order to diffuse boron shallowly. As a result, boron is diffused into the silicon substrate at a depth of about 2 $\mu$m at a high concentration.

Figure 5D:
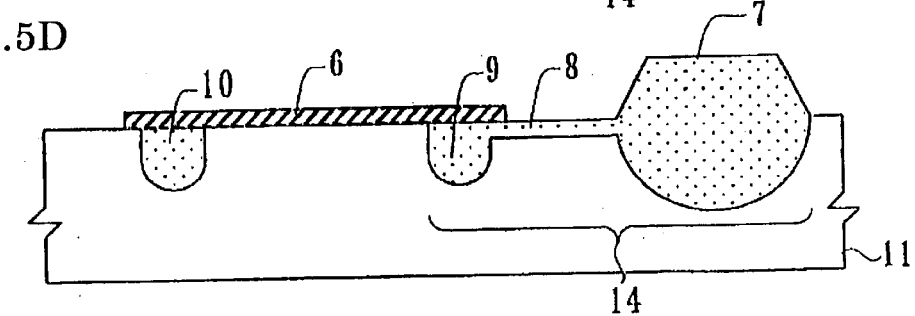

Then, as illustrated in FIG. 5D, the electrical insulator 6 comprised of a 1 $\mu$m-thick silicon dioxide film and a 0.05 $\mu$m-thick nitride film is formed on the silicon substrate 11 such that the electrical insulator 6 extends across the upper electrode 9 and the reinforcement 10.

Figure 5E:
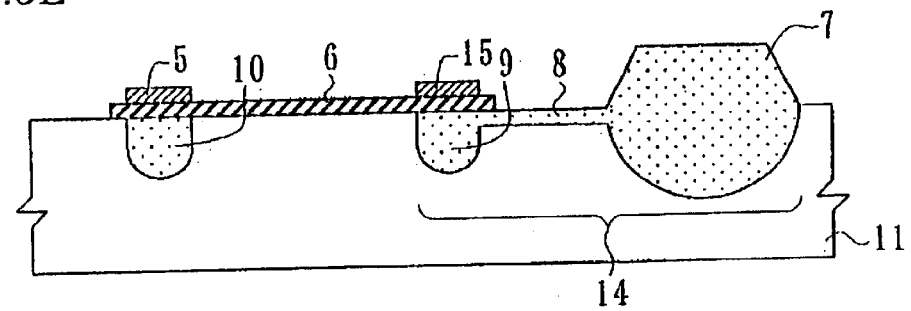

Then, as illustrated in FIG. 5E, the contact electrode 5 and the intermediate electrode 15 are formed on the electrical insulator 6 by gold plating above the reinforcement 10 and the upper electrode 9, respectively.

Figure 5F:
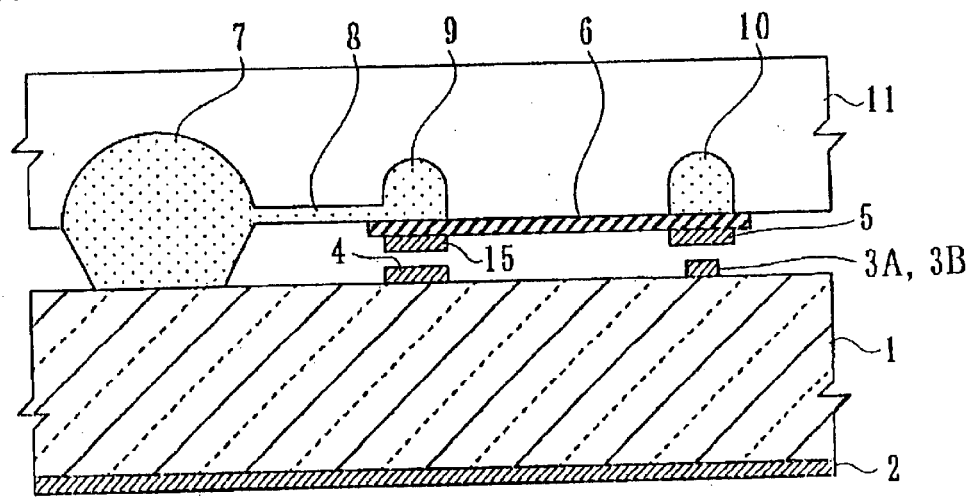

Then, as illustrated in FIG. 5F, there is in advance fabricated a glass substrate 1 separately from the substrate 11. The lower electrode 4 composed of gold and the signal lines 3A, 3B and 3a all composed of gold are formed on the glass substrate 1. The substrate 11 having been fabricated in accordance with the steps illustrated in FIGS. 5($a$) to 6($e$) is turned upside down, and is put on the glass substrate 1.

Thereafter, the supporter 7 is adhered to the glass substrate 1. The supporter 7 composed of silicon and the glass substrate 1 may be adhered to each other by electrostatic coupling.

Figure 5G:
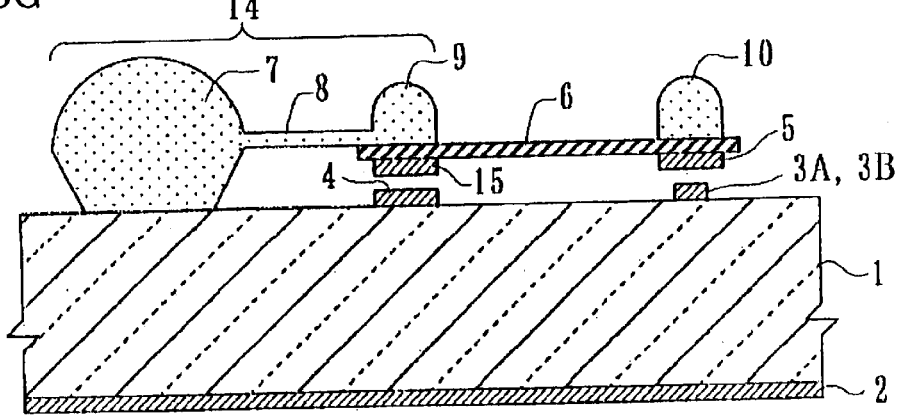

Then, as illustrated in FIG. 5G, the substrate 11 is dipped into an etching solution having a characteristic of selection to a boron concentration, such as ethylenediaminepyrocatechol, to thereby dissolve portions into which no boron is diffused. As a result, only the supporter 7, the cantilever 8, the upper electrode 9 and the reinforcement 10 remain on the glass substrate 1. Thus, there is completed the micro-machine switch as illustrated in FIGS. 4A and 4B.

When the substrate 1 is composed of ceramics or gallium arsenide, the supporter 7 may be adhered to the substrate 1 through an adhesive. As an alternative, the supporter 7 may be adhered to the substrate 1 by electrostatic coupling, if a glass layer having a thickness in the range of 2 $\mu$m to 5 $\mu$m is in advance formed on the substrate 1 by sputtering.

As mentioned above, in the second embodiment, the switch 14 comprised of the supporter 7, the cantilevers 8, the upper electrode 9 and the reinforcement 10 is formed by etching the single crystal silicon substrate 11. The second embodiment provides an advantage that the switch 14 could have highest reliability in its mechanical characteristic by composing the switch of single crystal material.

Since the cantilevers 8 are composed of single crystal material, curvature would not be generated due to a coefficient of thermal expansion, in comparison with the cantilever which is fabricated by layering a plurality of materials, in the conventional micro-machine switch. That is, since, variation in a coefficient of thermal expansion of the cantilever 8 in a direction perpendicular to the substrate 1 at the side closer to the substrate is designed symmetrical with the same at the side remoter from the substrate, curvature in the cantilever 8 is suppressed.

The micro-machine switch in accordance with the second embodiment may be fabricated in accordance with methods other than the above-mentioned one. For instance, a micro-machine switch having the same structure as that of the micro-machine switch in accordance with the second embodiment may be fabricated by forming a plurality of thin films on the substrate 1, and etching them in selected areas.

The switch 14 and the reinforcement 10 may be composed of amorphous silicon, polysilicon or highly resistive semiconductor such as GaAs or InP into which iron is doped, in place of single crystal silicon.

As an alternative, the switch 14 and the reinforcement 10 may be formed not of semiconductor, but of a metal such as gold or aluminum.

[Third Embodiment]

Figure 6A:
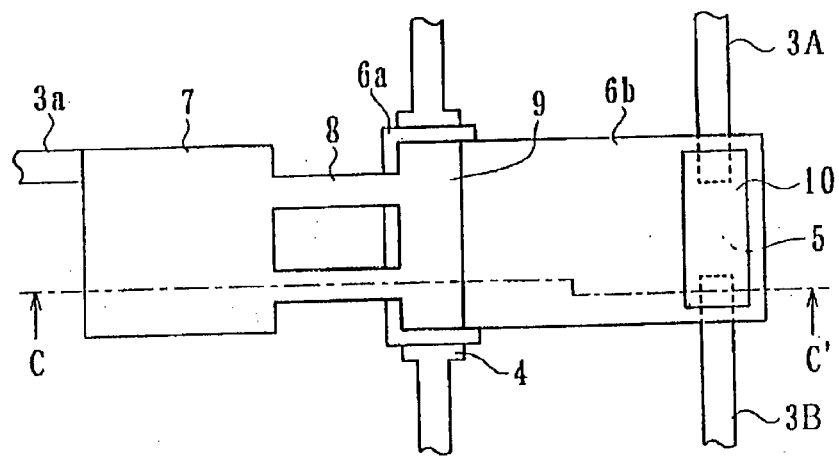
FIG. 6A is a plan view of a micro-machine switch in accordance with the third embodiment of the present invention.
Figure 6B:
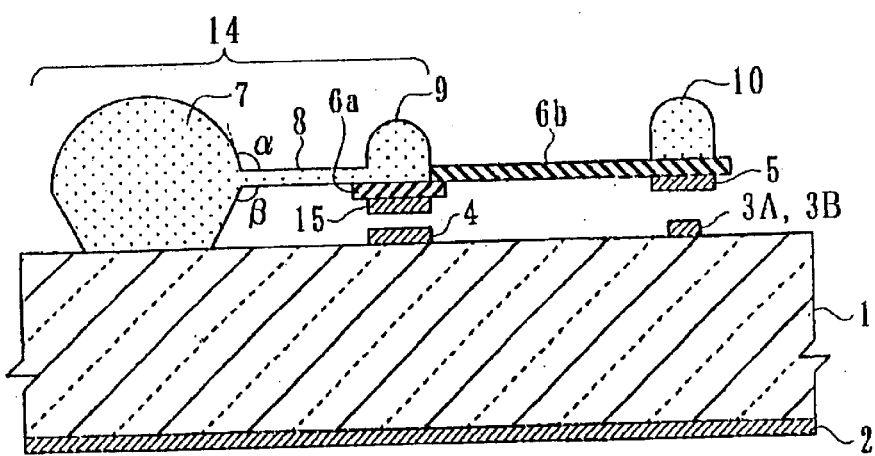
FIG. 6B is a cross-sectional view taken along the line C–C' in FIG. 6A.

FIG. 6A is a plan view of a micro-machine switch in accordance with the third embodiment of the present invention, and FIG. 6B is a cross-sectional view taken along the line C–C' in FIG. 6A. In FIG. 7, parts or elements that correspond to those illustrated in FIGS. 4A and 4B have been provided with the same reference numerals.

The micro-machine switch in accordance with the third embodiment is structurally different from the micro-machine switch in accordance with the second embodiment in that the electrical insulator 6b extends from a side surface of the upper electrode 9. That is, whereas the electrical insulator 6 extends towards the reinforcement 10, keeping in contact with a bottom surface of the upper electrode 9 in the micro-machine switch in accordance with the second embodiment, illustrated in FIGS. 4A and 4B, the electrical insulator 6b has a bottom surface in a plane in which a bottom surface of the upper electrode 9 exists and extends towards the reinforcement 10 in the micro-machine switch in accordance with the third embodiment, illustrated in FIG. 7.

The electrical insulator 6b may be composed of an oxide film, a nitride film or other electrically insulating thin films. As an alternative, the electrical insulator 6b may be composed of the same material as that of the upper electrode 9, in which case, the supporter 7, the cantilevers 8 and the upper electrode 9 may be composed of highly resistive semiconductor (GaAs or InP into which iron is doped), and impurities may be doped only into them for reducing a resistance thereof, or ions such as oxygen ions may be implanted into an area corresponding to the electrical insulator 6b to thereby increase a resistance thereof.

Though the reinforcement 10 is formed on the electrical insulator 6b in facing relation with the contact electrode 5 in the micro-machine switch in accordance with the third embodiment, it is not always necessary for the micro-machine switch to have the reinforcement 10.

The reinforcement 10 may be designed to have a high or low resistance.

In the micro-machine switch in accordance with the third embodiment, an electrical insulator 6a is formed on a bottom surface of the upper electrode 9, separately from the electrical insulator 6b. The electrical insulator 6a prevents the upper electrode 9 and the lower electrode 4 from making contact with each other to thereby short-circuit with each other, when a voltage is applied across the upper electrode 9 and the lower electrode 4.

It is preferable for the electrical insulator 6a to have a thickness smaller than a thickness of the contact electrode 5.

Since the electrical insulator 6b in the third embodiment is located more highly above the substrate 1 in comparison with the first embodiment, it is possible to form a greater gap between the contact electrode 5 and the signal lines 3A and 3B. This ensures a small electrostatic capacity and reduction in a leakage current when the micro-machine switch is off.

In the above-mentioned first to third embodiments, the substrate 1 is comprised of a glass substrate as a first example. A glass substrate is cheaper than a gallium-arsenide substrate, and is suitable to an application of the switch to a phased-array antenna on which a plurality of switches is requested to be integrated. However, the substrate 1 in the micro-machine switch in accordance with the present invention is not to be limited to a glass substrate, but may be comprised of a gallium-arsenide substrate, a silicon substrate, a ceramics substrate, a printing substrate or other substrates.

By forming a through-hole or through-holes with the upper electrode 9, it would be possible to reduce squeeze effect caused by air existing between the upper electrode 9 and the lower electrode 4.

By forming a through-hole or through-holes with the electrical insulator 6b, it would be possible to facilitate circulation of air to thereby reduce squeeze effect. In the micro-machine switches in accordance with the first to third embodiments, a strength of the electrical insulator 6b could be readily reinforced by the upper electrode 9 and the reinforcement 10. Hence, even if the electrical insulator 6b is formed with a plurality of through-holes, it would be possible for a movable part to have a sufficiently high stiffness.

In addition, by forming a through-hole or through-holes with the contact electrode 5 and the reinforcement 10 to thereby facilitate air circulation therethrough, it would be possible to prevent squeeze effect.

Hereinbelow is explained a method of fabricating the micro-machine switch in accordance with the third embodiment, illustrated in FIG. 7.

Figure 7A:
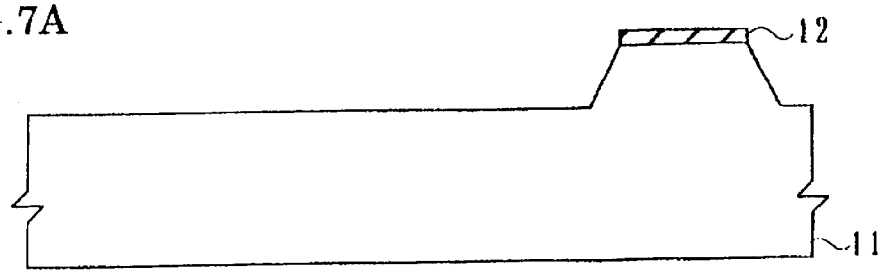
FIGS. 7A to 7H are cross-sectional views showing respective steps of a method of fabricating the micro-machine switch in accordance with the third embodiment, illustrated in FIGS. 6A and 6B.
Figure 7B:
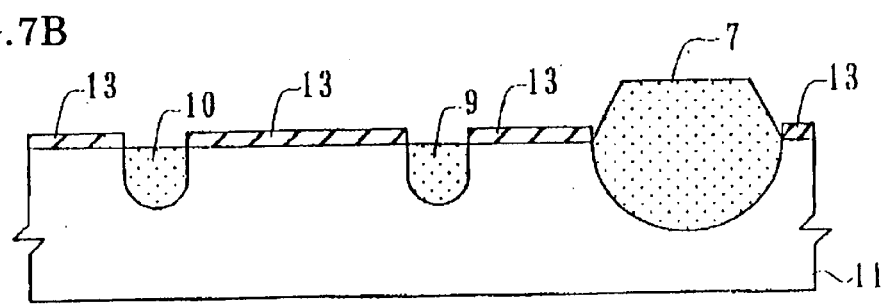
Figure 7C:
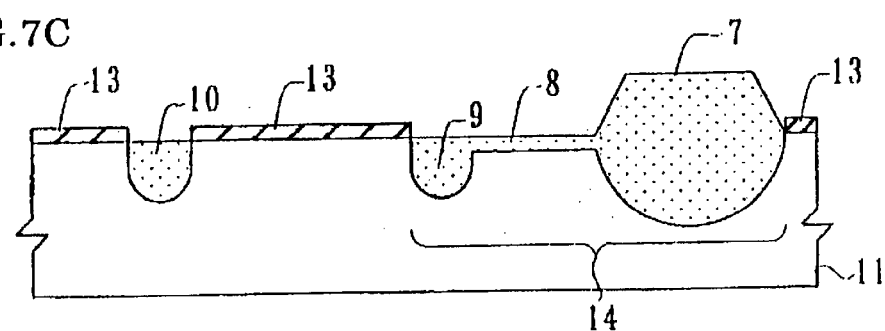
Figure 7D:
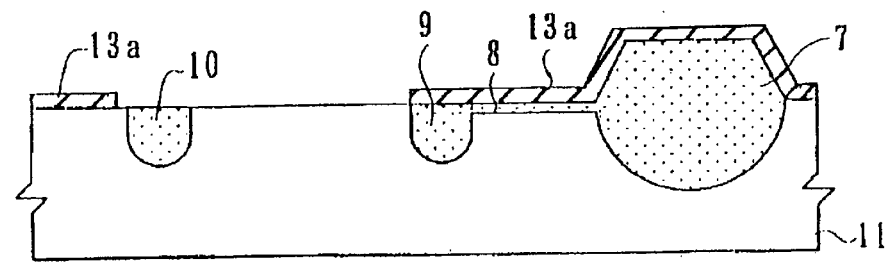
Figure 7E:
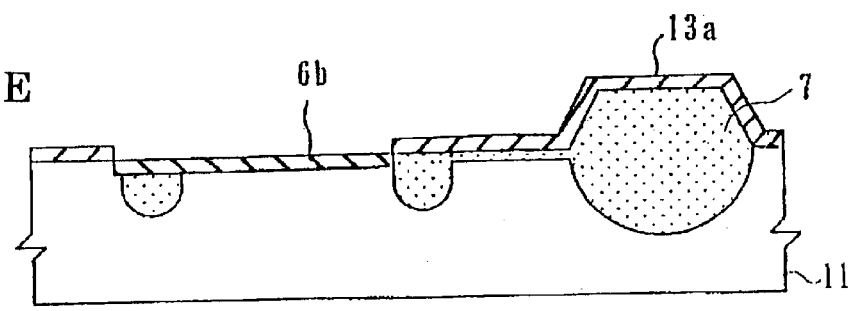
Figure 7F:
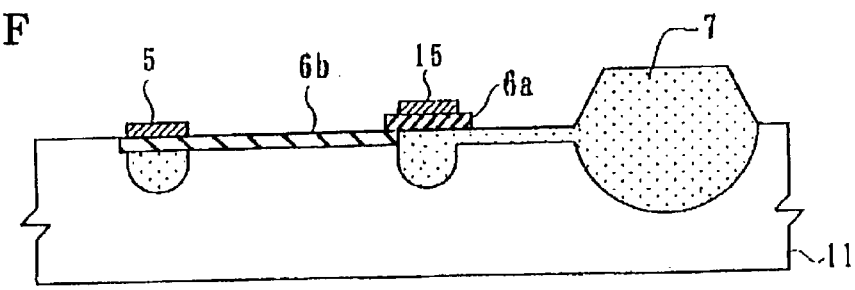
Figure 7G:
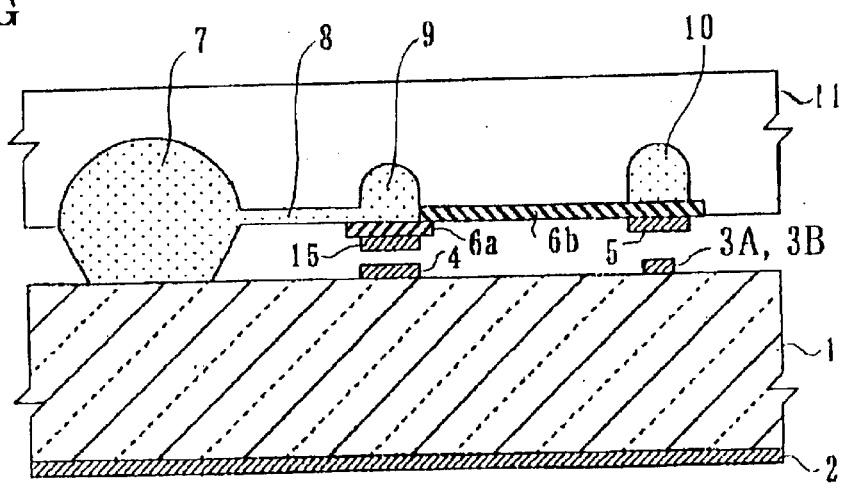
Figure 7H:
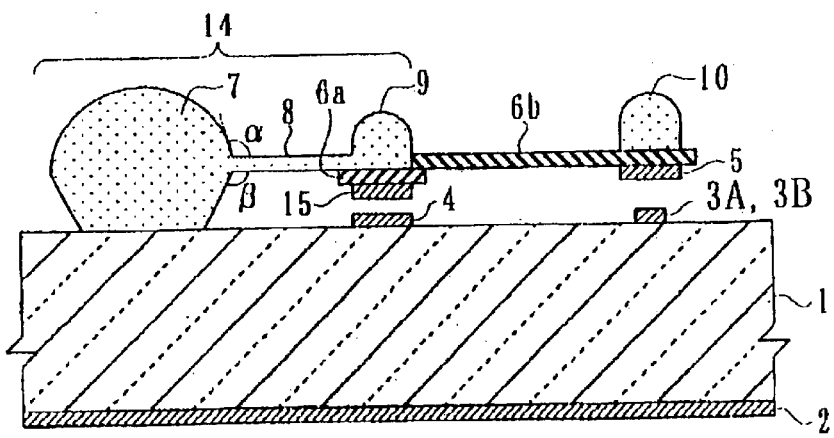
Figure 8:
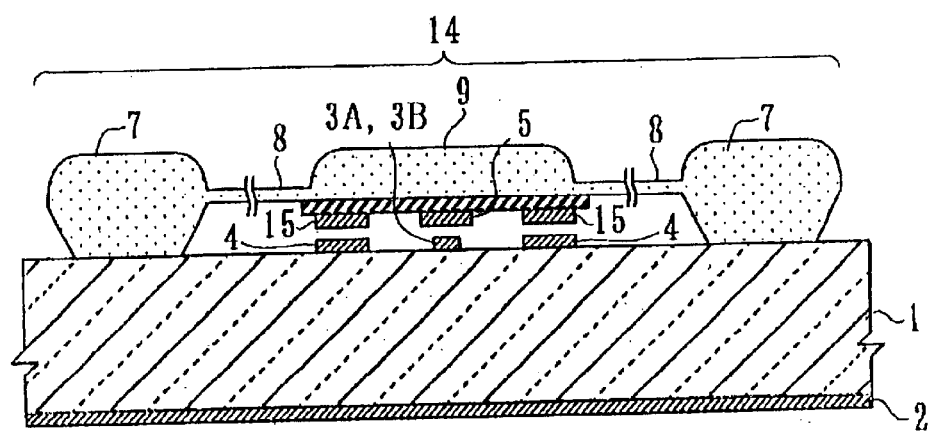
FIG. 8 is a cross-sectional view of a micro-machine switch in accordance with the fourth embodiment of the present invention.
Figure 9:
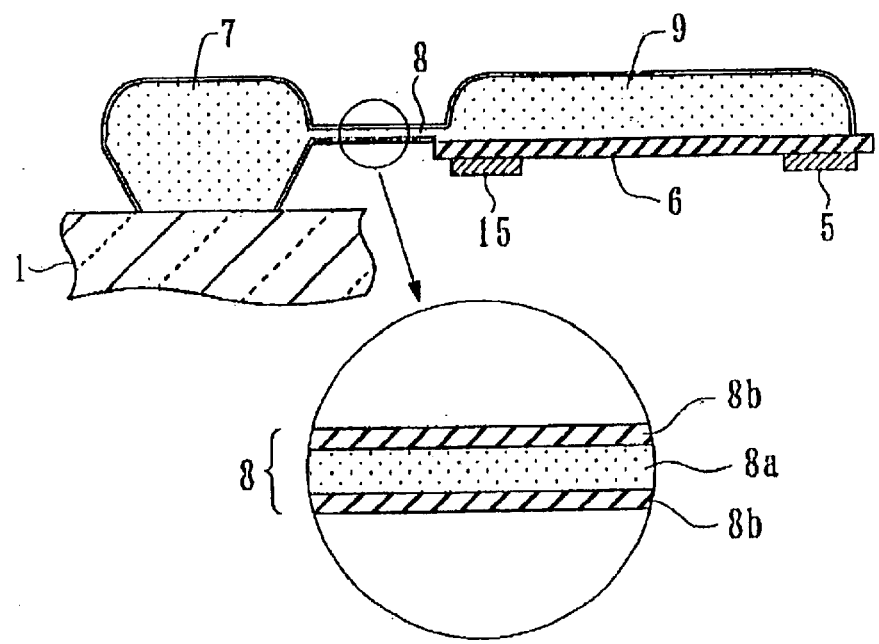
FIG. 9 is a cross-sectional view of a micro-machine switch in accordance with the fifth embodiment of the present invention.

FIGS. 8 and 9 are cross-sectional views illustrating respective steps of a method of fabricating the micro-machine switch in accordance with the third embodiment, illustrated in FIG. 7. Hereinbelow are explained steps in the method.

First, as illustrated in FIG. 7A, a pattern 12 comprised of a silicon dioxide film is formed on a silicon substrate 11. Then, the silicon substrate 11 is etched by about 6 µm through the use of tetramethylammonium hydroxide (TMAH) as an etchant.

When the silicon substrate 11 is comprised of a silicon substrate having (100) plane as a principal plane, a trapezoidal projection is formed under the pattern 12 after etching due to dependency of an etching rate on plane azimuth. The trapezoidal projection has (111) plane as an exposed sidewall.

Then, as illustrated in FIG. 7B, a pattern 13 is newly formed on the silicon substrate 11. Then, boron is diffused into non-masked area with the pattern 13 being used as a mask. Thereafter, the silicon substrate is thermally annealed, for instance, at 1150 degrees centigrade for 10 hours, in order to diffuse boron deeply. As a result, boron is diffused into the silicon substrate at a depth of about 10 µm at a high concentration. Thus, there are formed the supporter 7, the upper electrode 9, and the reinforcement 10.

Then, as illustrated in FIG. 7C, the pattern 13 is removed in an area corresponding to the cantilevers 8. Then, boron is diffused into the silicon substrate 11 in non-masked area with the rest of the pattern 13 being used as a mask. Thus, there is fabricated the switch 14 comprised of the supporter 7, the cantilevers 8 and the upper electrode 9.

The silicon substrate is thermally annealed, for instance, at 1150 degrees centigrade for 2 hours, in order to diffuse boron shallowly. As a result, boron is diffused into the silicon substrate at a depth of about 2 µm at a high concentration.

Then, as illustrated in FIG. 7D, a resist film 13a is formed all over the substrate 11, and then, the resist film 13a is removed by photolithography and etching only in an area corresponding to the electrical insulator 6b.

Then, as illustrated in FIG. 7E, oxygen ions are implanted into the substrate 11 with the resist film 13a being used as a mask, to thereby form the electrical insulator 6b in the substrate 11.

Then, as illustrated in FIG. 7F, the electrical insulator 6a is formed on the upper electrode 9 after removal of the resist film 13a. Then, the contact electrode 5 composed of gold is formed on the electrical insulator 6b above the reinforcement 10, and concurrently, the intermediate electrode 15 composed of gold is formed on the electrical insulator 6a above the upper electrode 9.

Then, as illustrated in FIG. 7G, there is in advance fabricated a glass substrate 1 separately from the substrate 11. The lower electrode 4 composed of gold and the signal lines 3A, 3B and 3a all composed of gold are formed on the glass substrate 1. The substrate 11 having been fabricated in accordance with the above-mentioned steps is turned upside down, and is put on the glass substrate 1.

Thereafter, the supporter 7 is adhered to the glass substrate 1. The supporter 7 composed of silicon and the glass substrate 1 may be adhered to each other by electrostatic coupling.

Then, as illustrated in FIG. 7H, the substrate 11 is dipped into an etching solution having a characteristic of selection to a boron concentration, such as ethylenediaminepyrocatechol, to thereby dissolve portions into which no boron is diffused. As a result, only the supporter 7, the cantilever 8, the upper electrode 9 and the reinforcement 10 remain on the glass substrate 1. Thus, there is completed the micro-machine switch as illustrated in FIG. 7.

When the substrate 1 is composed of ceramics or gallium arsenide, the supporter 7 may be adhered to the substrate 1 through an adhesive. As an alternative, the supporter 7 may be adhered to the substrate 1 by electrostatic coupling, if a glass layer having a thickness in the range of 2 $\mu$m to 5 $\mu$m is in advance formed on the substrate 1 by sputtering.

[Fourth Embodiment]

FIG. 8 is a cross-sectional view of a micro-machine switch in accordance with the fourth embodiment. In FIG. 8, parts or elements that correspond to those in the micro-machine switch in accordance with the first embodiment, illustrated in FIGS. 2A and 28, have been provided with the same reference numerals.

As illustrated in FIG. 8, the micro-machine switch in accordance with the fourth embodiment is designed to have two supporters 7 on the substrate 1 symmetrically around the signal lines 3A and 3B. The upper electrode 9 is connected to the cantilevers 8 each extending from each of the supporters 7. Namely, the upper electrode 9 is supported at opposite ends thereof.

In order to generate a sufficient electrostatic force, the micro-machine switch includes two intermediate electrodes 15 and two lower electrodes 4 symmetrically around the signal lines 3A and 3B.

As mentioned above, the upper electrode 9 may be supported by the two supporters 7.

The number of the supporters 7 is not to be limited to two. Three or more supporters 7 may be used for supporting the upper electrode 9.

When the two supporters 7 are used, though it is preferable that the two supporters 7 are arranged symmetrically around the upper electrode, it is not always necessary to do so. Similarly, when three or more supporters 7 are to be used, though it is preferable that the supporters 7 are arranged in the same circumference angle around the upper electrode 9, it is not always necessary to do so.

The fourth embodiment has a structure in which two supporters 7 are formed symmetrically around the upper electrode 9 in the micro-machine switch in accordance with the first embodiment, illustrated in FIGS. 2A and 2B. Similarly, two supporters 7 may be formed symmetrically around the reinforcement in the micro-machine switch in accordance with the second and third embodiments, illustrated in FIGS. 4 and 7, respectively.

A method of fabricating the micro-machine switch in accordance with the fourth embodiment is almost the same as the method of fabricating the micro-machine switch in accordance with the first embodiment, illustrated in FIGS. 2A and 2B.

In the steps illustrated in FIGS. 2(a) and 2(b), two trapezoidal projections are formed on the substrate 11. Impurities are diffused into the two trapezoidal projections to thereby form two supporters 7. In the step illustrated in FIG. 3C, there are formed two cantilevers 8 each connecting each of the two supporters 7 to the upper electrode 9. The steps to be carried out thereafter are the same as the steps of the method of fabricating the micro-machine switch in accordance with the first embodiment.

Similarly, in methods of fabricating the micro-machine switches in accordance with the second and third embodiments, the steps are modified so as to form the two supporters 7, the cantilevers 8, the upper electrode 9, the intermediate electrode 15 and the lower electrode 4 symmetrically around the reinforcement 10.

[Fifth Embodiment]

FIG. 9 is a partial cross-sectional view of the micro-machine switch in accordance with the fifth embodiment of the present invention. In FIG. 9, parts or elements that correspond to those in the micro-machine switch in accordance with the first embodiment, illustrated in FIGS. 2A and 2B, have been provided with the same reference numerals.

As illustrated in FIG. 9, in the micro-machine switch in accordance with the fifth embodiment, each of the cantilevers 8 is designed to be comprised of a silicon layer 8a and silicon dioxide layers 8b sandwiching the silicon layer 8a therebetween. The silicon dioxide layers are formed by oxidizing a surface of the switch 14 or other processes. The two silicon dioxide layers 8b have the same thickness.

By designing the silicon dioxide layers 8b to have the same thickness, a coefficient of thermal expansion in an area of the cantilevers 8 facing the substrate 1 is symmetrical with a coefficient of thermal expansion in an area of the cantilevers 8 at a side opposite to the substrate 1. This ensures prevention of curvature in the cantilevers 8 even if the cantilevers 8 are annealed at a high temperature.

[Sixth Embodiment]

Figure 10:
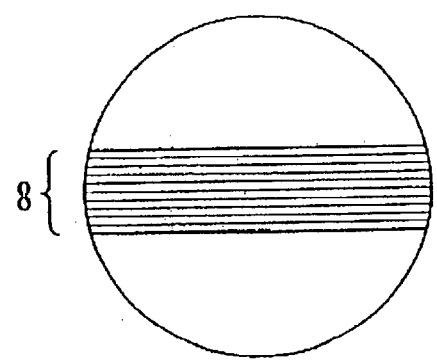
FIG. 10 is a partial cross-sectional view of a micro-machine switch in accordance with the sixth embodiment of the present invention.

FIG. 10 is a cross-sectional view of the micro-machine switch in accordance with the sixth embodiment of the present invention. In FIG. 10, parts or elements that correspond to those in the micro-machine switch in accordance with the first embodiment, illustrated in FIGS. 2A and 2B, have been provided with the same reference numerals.

As illustrated in FIG. 10, each of the cantilevers 8 in the sixth embodiment is designed to have a superlattice structure in which films composed of two or more different materials are alternately stacked one on another. Similarly to the fifth embodiment, the sixth embodiment ensures that a coefficient of thermal expansion in an area of the cantilevers 8 facing the substrate 1 is symmetrical with a coefficient of thermal expansion in an area of the cantilevers 8 at a side opposite to the substrate 1. Thus, it is possible to prevent curvature in the cantilevers 8 caused by variation in temperature.

[Seventh Embodiment]

Figure 11A:
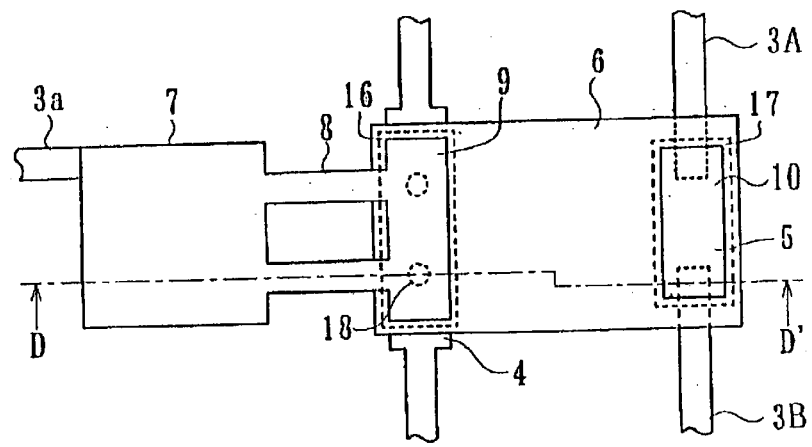
FIG. 11A is a plan view of a micro-machine switch in accordance with the seventh embodiment of the present invention.
Figure 11B:
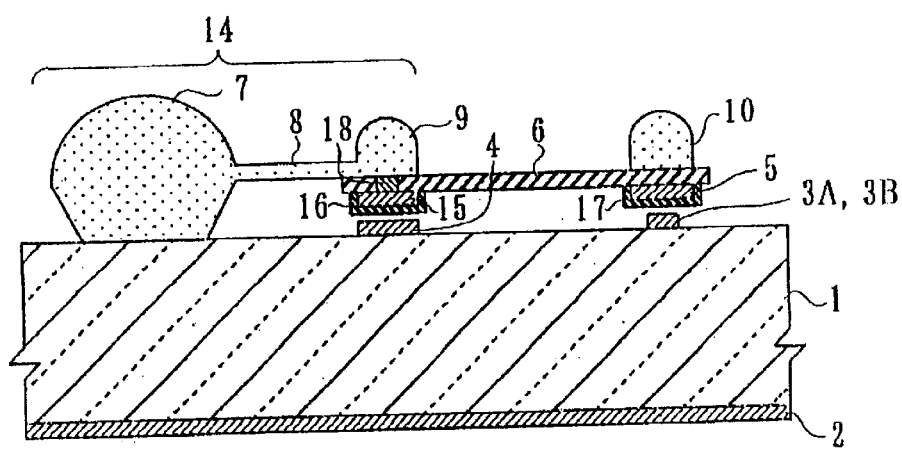
FIG. 11B is a cross-sectional view taken along the line D–D' in FIG. 11A.
Figure 13:
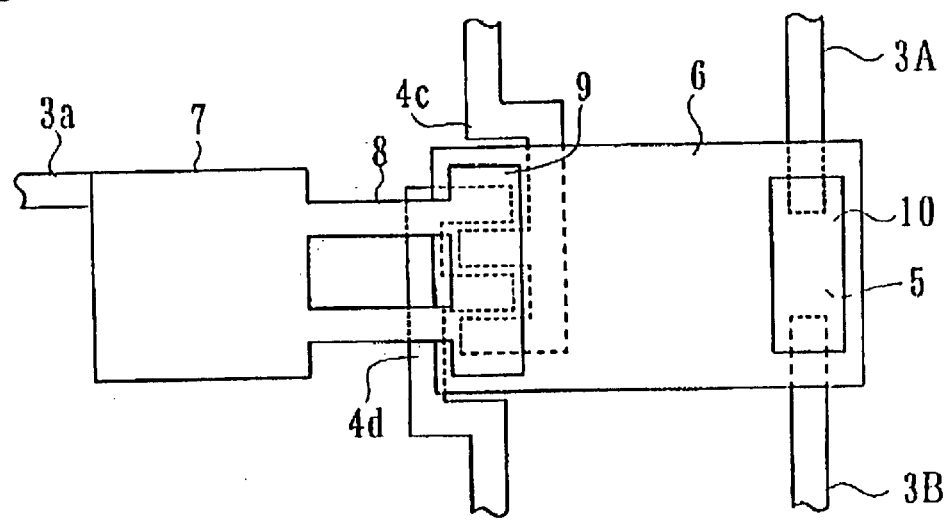
FIG. 13 is a plan view of a micro-machine switch in accordance with the ninth embodiment of the present invention.

FIG. 11A is a plan view of a micro-machine switch in accordance with the seventh embodiment of the present invention, and FIG. 11B is a cross-sectional view taken along the line D–D' in FIG. 11A. In FIG. 13, parts or elements that correspond to those in the micro-machine switch in accordance with the second embodiment, illustrated in FIGS. 4A and 4B, have been provided with the same reference numerals.

As illustrated in FIG. 13, the micro-machine switch in accordance with the seventh embodiment is structurally different from the micro-machine switch in accordance with the second embodiment in that the intermediate electrode 15 is electrically connected to the upper electrode 9 through a wire 18 filled in a through-hole formed through the electrical insulator 6, and that the intermediate electrode 15 ad the contact electrode 5 are covered with electrically insulating films 16 and 17, respectively. The micro-machine switch in accordance with the seventh embodiment has the same structure as that of the micro-machine switch in accordance with the second embodiment, illustrated in FIGS. 4A and 4B, except the above-mentioned differences.

Since the intermediate electrode 15 is electrically connected to the upper electrode 9, the intermediate electrode 15 has the same potential as that of the upper electrode 9.

The electrically insulating film 16 covering the intermediate electrode 15 prevents the intermediate electrode 16 and the lower electrode 4 from short-circuiting each other.

The electrically insulating film 17 covering the contact electrode 5 is formed in symmetry with the electrically insulating film 16 in order to make contact with the signal lines 3A and 3B, when the electrically insulating film 16 makes contact with the lower electrode 4.

The intermediate electrode 15 may be electrically connected to the upper electrode 9 through a wire formed at an end of the electrical insulator 6, in place of the wire 18 embedded in the electrical insulator 16.

The electrical insulator 6 to be formed between the intermediate electrode 15 and the upper electrode 9 may be omitted, in which case, the intermediate electrode 15 is formed directly on a bottom surface of the upper electrode 9.

The lower electrode 4 and the signal lines 3A and 3B may be partially covered with the electrically insulating films 16 and 17.

A switch for turning a DC signal on or off can be fabricated by omitting the electrically insulating film 17 covering the contact electrode 5 therewith, and designing a sum of thicknesses of the intermediate electrode 15 and the electrically insulating film 16 to be smaller than a thickness of the contact electrode 5.

It is possible to prevent the intermediate electrode 15 and the lower electrode 4 from short-circuiting each other also by omitting the electrically insulating film 16, and designing a thickness of the intermediate electrode 15 to be smaller than either a thickness of the contact electrode 5 or a sum of thicknesses of the contact electrode 5 and the electrically insulating film 17.

The electrically insulating film 16 may be formed covering both the intermediate electrode 15 and the lower electrode 4 therewith. Similarly, the electrically insulating film 17 may be formed covering both the contact electrode 5 and the signal lines 3A and 3B therewith.

It is not always necessary for the electrically insulating films 16 and 17 to entirely cover the intermediate electrode 15 and the contact electrode 5 therewith, respectively. The electrically insulating films 16 and 17 may be designed to partially cover intermediate electrode 15 and the contact electrode 5 therewith, respectively.

[Eighth Embodiment]

Figure 12:
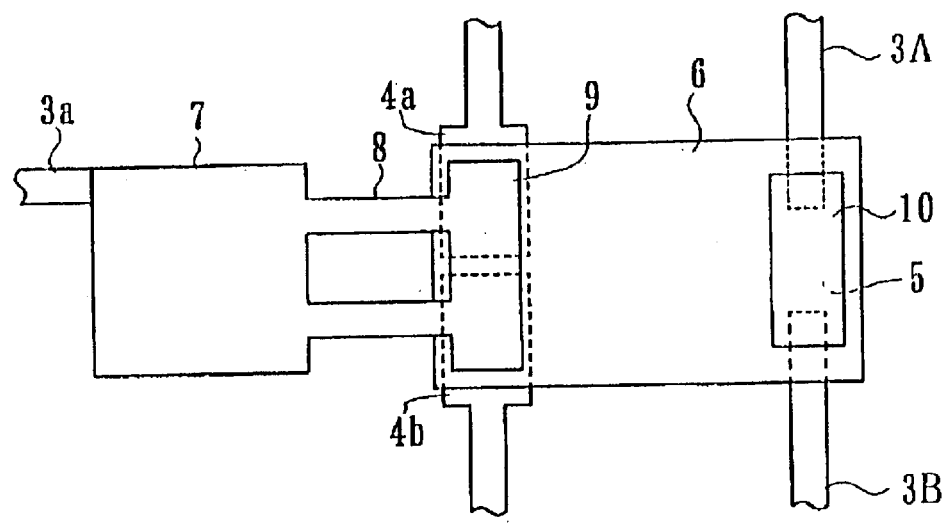
FIG. 12 is a plan view of a micro-machine switch in accordance with the eighth embodiment of the present invention.

FIG. 12 is a plan view of a micro-machine switch in accordance with the eighth embodiment of the present invention. In FIG. 12, parts or elements that correspond to those in the micro-machine switch in accordance with the first embodiment, illustrated in FIGS. 2A and 2B, have been provided with the same reference numerals.

As illustrated in FIG. 12, the micro-machine switch in accordance with the eighth embodiment is structurally different from the micro-machine switch in accordance with the second embodiment in that the lower electrode is comprised of two lower electrodes 4a and 4b such that the lower electrode could have two electrically different potentials below the intermediate electrode 15.

In the micro-machine switch in accordance with the eighth embodiment, a voltage is applied to both the lower electrodes 4a and 4b, and the supporter 7 connected to the upper electrode 9 is electrically floating. A half of the voltage applied across the two lower electrodes 4a and 4b is exerted between the lower electrodes 4a and 4b, and the intermediate electrode 15.

Thus, since a voltage causing an electrostatic attractive force for closing the switch is reduced down to a half, the switch can be closed by applying a voltage twice greater than the voltage applied in the second embodiment.

Since the upper electrode 9 is in an electrically floating condition, there is not caused a problem that the electrical insulator 6 located between the upper electrode 9 and the lower electrodes 4a and 4b are destroyed because of a high voltage. Above all, since it is not necessary to form the signal line 3a through which a voltage is applied to the supporter 7, there is provided an advantage that wire arrangement in the device can be simplified.

Though a method of operating a micro-machine switch with the supporter 7 being kept in an electrically floating condition, having been explained in the first embodiment, may be accompanied with a problem that the micro-machine switch is influenced by surrounding wires (for instance, when a plurality of micro-machines are arranged, voltages for driving the micro-machines may be different from one another), a micro-machine switch can be operated without being influenced by surroundings in accordance with the present embodiment.

Though the upper electrode 9 is connected to the cantilevers 8 in the present embodiment, the upper electrode 9 may be omitted, because a potential of the intermediate electrode 16 can be determined based on the two lower electrodes 4a and 4b.

The upper electrode 9 may be used as a reinforcement. The upper electrode 9 may be separated from the cantilevers 8. The supporter 7, the cantilevers 8 and the upper electrode 9 may be composed of an electrically insulating material or a highly resistive semiconductor material.

[Ninth Embodiment]

FIG. 13 is a plan view of a micro-machine switch in accordance with the ninth embodiment of the present invention. In FIG. 13, parts or elements that correspond to those in the micro-machine switch in accordance with the eighth embodiment, illustrated in FIG. 12, have been provided with the same reference numerals.

As illustrated in FIG. 13, in the micro-machine switch in accordance with the ninth embodiment, similarly to the micro-machine switch illustrated in FIG. 12, the lower electrode is comprised of two lower electrodes 4c and 4d such that the lower electrode could have two electrically different potentials below the intermediate electrode 15. The ninth embodiment is structurally different from the eighth embodiment in that the lower electrodes 4c and 4d are designed to have a comb-shaped structure unlike the lower electrodes 4a and 4b.

In the eighth embodiment illustrated in FIG. 12, the lower electrodes 4a and 4b have to be arranged symmetrically around a center of the upper electrode 9, when the switch 14 is adhered to the substrate 1. That is, unless an area in which the intermediate electrode 15 overlaps the lower electrode 4a is equal in size to an area in which the intermediate electrode 15 overlaps the lower electrode 4b, a potential of the intermediate electrode 15 does not become equal to a half of a voltage applied to the lower electrodes 4a and 4b, and resultingly, the upper electrode 9 may be attracted to a lower electrode having a larger area. As a result, the cantilevers 8 are twisted.

In order to solve such a problem, the lower electrodes 4c and 4d are designed to have a comb-shaped structure in the present embodiment. The comb-shaped structure ensures that an area in which the upper electrode 9 overlaps the lower electrode 4d is equal in size to an area in which the upper electrode 9 overlaps the lower electrode 4d, even if the switch 14 is adhered to the substrate in deviation.

Though the lower electrodes 4c and 4d illustrated in FIG. 13 are illustrated as having two combs, the number of combs is not to be limited to two. The lower electrodes 4c and 4d may have three or more combs. The combs may be designed to extend in any direction.

In the eighth embodiment illustrated in FIG. 12 and the ninth embodiment illustrated in FIG. 13, the upper electrode 9 may be electrically separated into two or more electrodes, in place of separating the lower electrode into two or more electrodes. As an alternative, both the upper and lower electrodes may be separated into a plurality of electrodes.

The number of electrodes into which the upper and/or lower electrodes are(is) separated is not to be limited to two, and may be three or four or greater.

[Tenth Embodiment]

The micro-machine switches in accordance with the above-mentioned first to ninth embodiments can be used for switching a signal in the range of a direct current signal to an alternating current having a high frequency, and in particular, is suitable to a phased-array antenna. Hereinbelow is explained an application of the micro-machine switches to a phase-array antenna.

Figure 14:
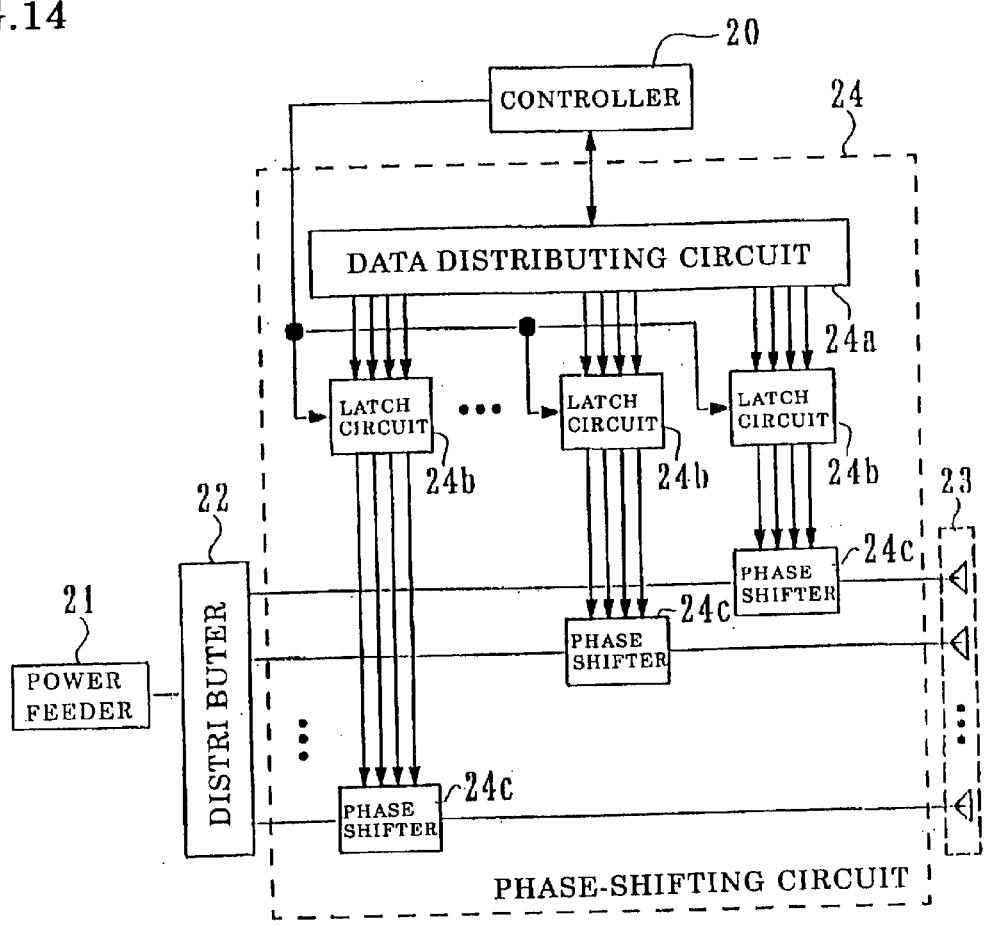
FIG. 14 is a block diagram of a phased-array antenna in accordance with the tenth embodiment of the present invention.

FIG. 14 is a block diagram of a phase-array antenna suggested in Japanese Patent Application No. 10-176367 (Japanese Unexamined Patent Publication No. 11-74717). The Publication No. 11-74717 is explained hereinbelow only for the purpose of better understanding of the present invention. Reference to the Publication No. 11-74717 does not mean that the applicant admits that Publication No. 11-74717 constitutes prior art to the present invention.

The illustrated phased-array antenna includes M antennas 23 (M is an integer equal to or greater than 2), which are electrically connected to a phase-shifting circuit 24. The phase-shifting circuit 24 is comprised of a data distributing circuit 24a, M data latching circuits 24b electrically connected to the data distributing circuit 24a, and M N-bit (N is an integer) phase shifters 24c each electrically connected to an associated data latching circuit 24b.

Each of the antennas 23 is electrically connected to the associated phase shifter 24c, and the phase shifters 24c are electrically connected to a power feeder 21 through a distributor and synthesizer 22.

The data distributing circuit 24a is electrically connected to a controller 20. The data distributing circuit 24a and the data latching circuits 24b are formed as a thin film transistor circuit (TFT circuit) on a substrate.

Each of the phase shifters 24c is designed to include one of the micro-machine switches in accordance with the above-mentioned first to ninth embodiments, for each of bits. Each of the data latching circuits 24b is electrically connected to a micro-machine switch in the associated phase shifters 24c.

In the phased-array antenna illustrated in FIG. 14, a circuit for driving phase shifters, which has been conventionally formed as an externally additional 1C, is comprised of the TFT circuit, and is formed in the same layer as the phase shifters 24c.

Hereinbelow is explained an operation of the phased-array antenna illustrated in FIG. 14.

The controller 20 calculates a degree of phase-shifting optimal for directing radiated beams to a desired direction, with an accuracy of N bits, based on predetermined locations of the antennas 23 and frequencies selected in the antennas 23. The calculation results are output to the data distributing circuit 24a as a control signal.

The data distributing circuit 24a distributes the control signal to the data latching circuits 24b.

Directions in which radio waves are directed from the antennas 23 are simultaneously switched in all the antennas 23. In this end, the data latching circuits 24b rewrite data stored therein into a control signal as input data in synchronization with a timing signal by which a direction in which a beam is radiated is switched, and apply a drive voltage at a time to the micro-machine switches in a bit selected by the phase shifters 24c, based on newly stored data (that is, a control signal).

On application of a drive voltage to the micro-machine switch, the micro-machine switch is closed, and resultingly, a bit including the micro-machine switch is turned on. A degree of phase shifting in the phase shifter 24c is determined in accordance with bits turned on in the phase shifter 24c.

Each of the phase shifters 24c varies a phase of a radio-frequency signal by the thus determined degree of phase shifting, and supplies electric power to the antennas 23. Each of the antennas 23 makes radiation in a phase determined in accordance with the supplied phase. The radiation defines an equiphase plane. Beams are radiated in a direction perpendicular to the equiphase plane.

Hereinbelow is explained a structure of the phased-array antenna illustrated in FIG. 14.

Figure 15:
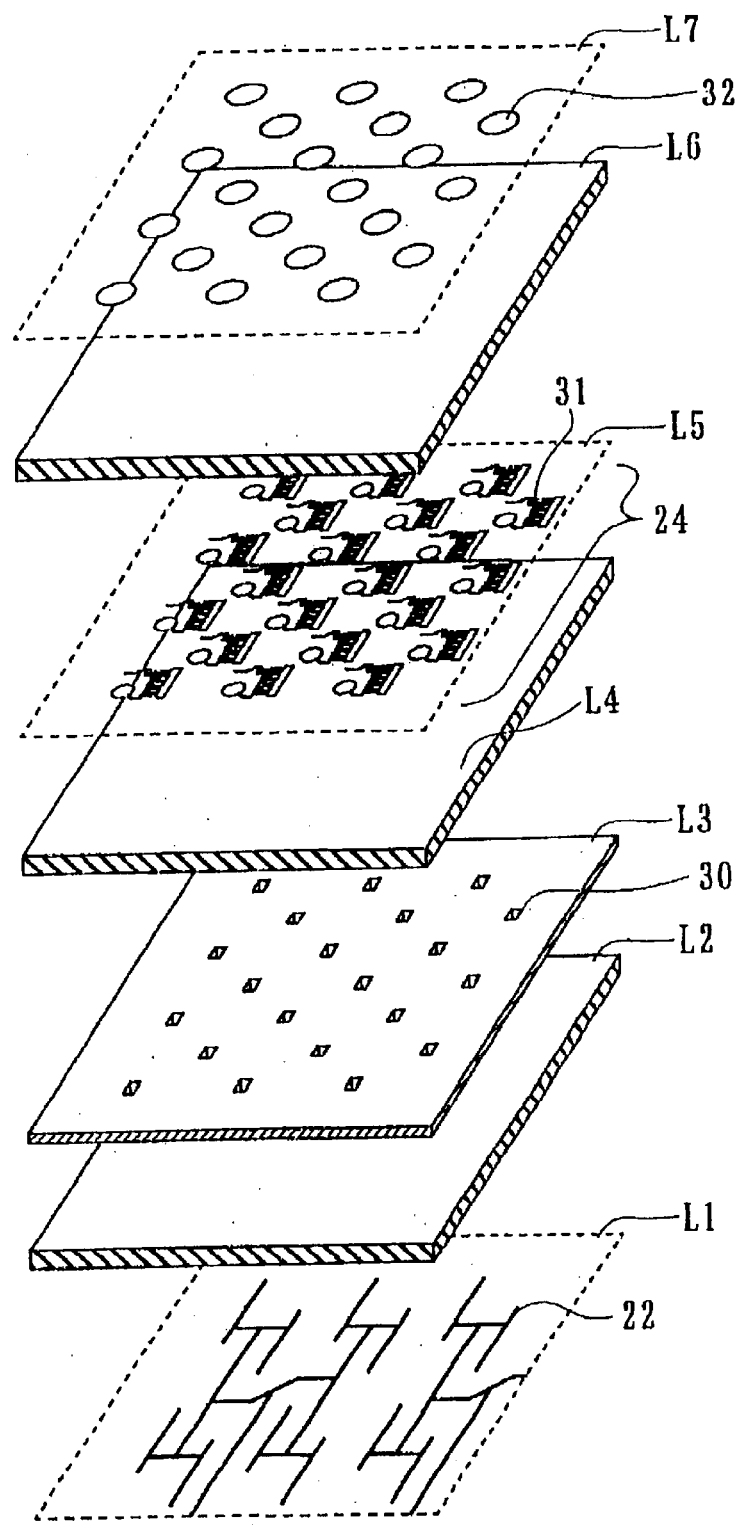
FIG. 15 is an exploded perspective view illustrating a structure of the phased-array antenna illustrated in FIG. 14.

FIG. 15 is an exploded perspective view of the phased-array antenna.

As illustrated, the phased-array antenna has a multi-layered structure. Specifically, the phased-array antenna is comprised of a distribution and synthesis layer L1, a dielectric substance layer L2, a slot layer L3 used for power feeding, a dielectric substance layer L4, a layer L5 including a radiator, a phase shifter, and a TFT circuit (hereinbelow, a layer L5 is referred to as "a phase-shifting circuit layer"), a dielectric substance layer L6, and a parasitic device layer L7. The layers are closely adhered to one another.

The layers make a multi-layered structure by either photolithography and etching or adhesion process.

For instance, the parasitic device layer L7 and the phase-shifting circuit layer L5 are formed by carrying out photolithography and etching to a metal film formed on opposite surfaces of the dielectric substance layer L6. The slot layer L3 is formed by carrying out photolithography and etching to a metal film formed on a surface of the dielectric substance layer L4.

A plurality of parasitic devices 32 is arranged on the parasitic device layer L7. The parasitic devices 32 enlarge an antenna band, and electromagnetically coupled to radiators 31 formed in the phase-shifting circuit layer L5, through the dielectric substance layer L6.

The dielectric substance layer L6 is composed of a dielectric substance having a dielectric constant in the range of about 2 to about 10. For instance, fabrication costs could be reduced by using glass as a dielectric substance. Hence, it is preferable that at least one of the dielectric substance layers is a glass layer.

If fabrication costs are ignored, the dielectric substance layer L6 may be composed of a dielectric substance such as alumina having a high dielectric constant or foaming material having a low dielectric constant.

On the phase-shifting circuit layer L6 are formed a part of the antennas 23 illustrated in FIG. 14, the phase-shifting circuit 24, and strip lines through which power is fed to the antennas 23.

The dielectric substance layer LA is composed of a dielectric substance having a dielectric constant in the range of about 3 to about 12, such as alumina.

The slot layer L3 is composed of electrically conductive metal, and is formed with a plurality of slots 30 through which power is to be fed. The slot layer L3 is electrically connected to the phase-shifting circuit layer L5 through through-holes formed through the dielectric substance layer L4, and acts as a ground for the phase-shifting circuit layer L5.

A plurality of distributor and synthesizers 22 are formed on the distribution and synthesis layer L1. The distributor and synthesizers 22 are electromagnetically connected to the phase-shifting circuit layer L5 through the slots 30 formed through the slot layer L3. Each of the distributor and synthesizers 22 and each of the slots 30 define one power feeding unit, and the power feeding units are arranged in a matrix.

It is not always necessary to arrange the power feeding units in a matrix. The power feeding units may be arranged in a non-matrix.

The radiators 31 may be arranged in a matrix or two-dimensionally. As an alternative, the radiators 31 may be arranged in a line in a direction.

In FIG. 15, the distributor 22 and the phase-shifting circuit layer L5 are electromagnetically coupled to each other through the slot layer L3. However, the distributor 22 and the phase-shifting circuit layer L5 may be formed in a common plane, if the distributor 22 and the phase-shifting circuit layer L5 are connected to each other through a power feeding coupler such as a power feeding pin.

Hereinbelow is explained the phase-shifting circuit layer L5 illustrated in FIG. 15.

Figure 16:
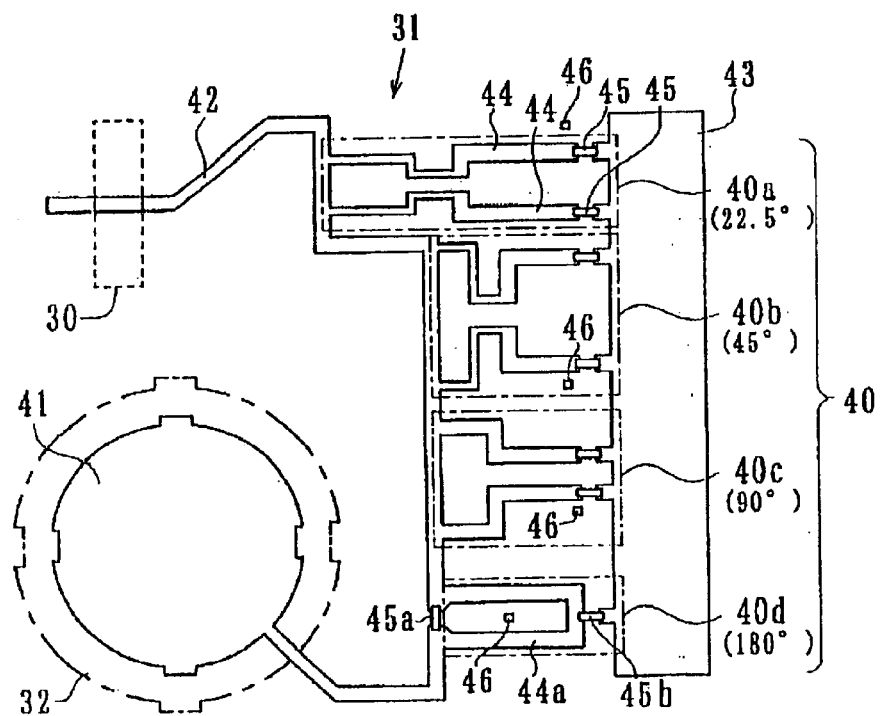
FIG. 16 is a plan view of a phase-shifting circuit used in the phased-array antenna illustrated in FIG. 14.

FIG. 16 is a plan view illustrating the phase-shifting circuit layer L5 in one unit.

As illustrated, a radiator 41, a group of phase shifters 40 including four phase shifters 40a, 40b, 40c and 40d, and data latching circuits 46 are formed on the dielectric substance layer L6 comprised of a glass substrate or other materials. Each of the data latching circuits 46 is formed for each bits of the phase shifters 40a, 40b, 40c and 40d.

A strip line 42 extends from the radiator 41 to a location which is in alignment with the slot 30 illustrated in FIG. 15, through the phase shifters 40.

The radiator 41 may be comprised of a patch antenna, a printed dipole, a slot antenna, or an aperture device. The strip line 42 may be comprised of a distributed constant line such as a micro-strip line, a triplet line, a coplanar line, or a slot line.

The phase shifters 40 illustrated in FIG. 16 include four phase shifters 40a, 40b, 40c and 40d, and define a 4-bit phase shifter. Each of the phase shifters 40a, 40b, 40c and 40d can vary a phase in fed power by 22.5 degrees, 45 degrees, 90 degrees, and 180 degrees, respectively, and is comprised of a strip line and a micro-machine switch.

Each of the phase shifters 40a, 40b and 40c is comprised of two strip lines 44 electrically connected between the strip line 42 and the ground 43, and a micro-machine switch 45 incorporated in the strip line 44. The phase shifters 40a, 40b and 40c define a loaded line type phase shifter.

The phase shifter 40d is comprised of a micro-machine switch 45a incorporated in the strip line 42, a U-shaped strip line 44a, and a micro-machine switch 45b electrically connected between the strip line 44a and the ground 43. The phase shifter 40d defines a switched line type phase shifter.

The loaded line type phase shifter would have better characteristics for a small degree of phase shifting, whereas the switched line type phase shifter would have better characteristic for a great degree of phase-shifting. Hence, in the present embodiment, the loaded line type phase shifters 40a, 40b and 40c are used as 22.5-degrees, 45-degrees and 90-degrees phase shifters, respectively, as mentioned earlier, and the switched line type phase shifter 40d is used as a 180-degrees phase shifter. The switched line type phase shifters may be used as the phase shifters 40a, 40b and 40c.

The two micro-machine switches 45, 45a and 45b included in each of the phase shifters 40a, 40b, 40c and 40d are electrically connected to a data latching circuit 46 positioned in the vicinity thereof, and are simultaneously operated by a drive voltage output from the data latching circuit 46.

As mentioned above, a radio-frequency signal running through the strip line 42 has a phase varied in accordance with an operation of the phase shifters 40.

In place of positioning the data latching circuit 46 in the vicinity of micro-machine switches 45, 45a and 45b, a plurality of the data latching circuits 46 may be arranged at a certain site, and electrically connected to the micro-machine switches 45, 45a, and 46b for driving the micro-machine switches 45, 45a, and 45b.

As an alternative, one data latching circuit 46 may be electrically connected to the micro-machine switched 45, 45a and 45b each in one of units different from one another.

Figure 17:
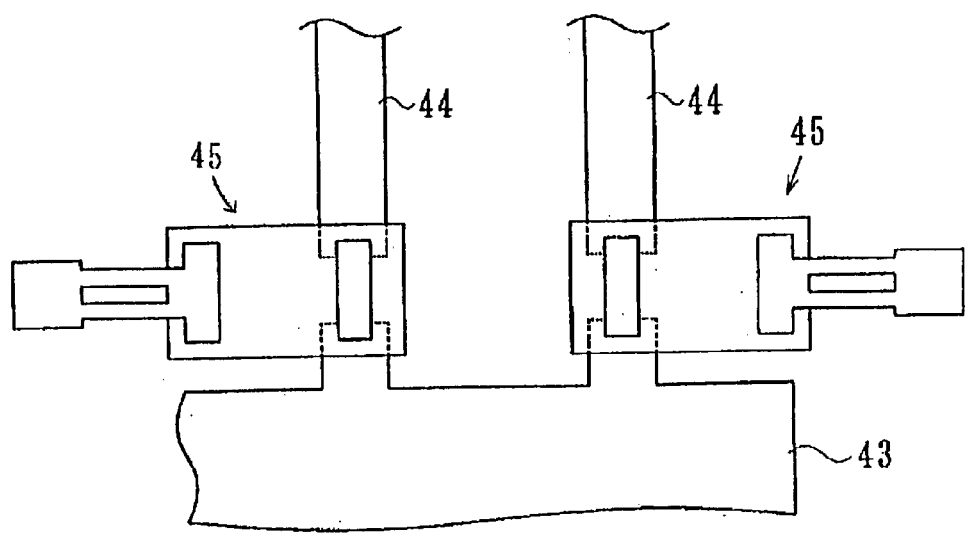
FIG. 17 is a plan view illustrating a periphery of a micro-machine switch including the phase-shifting circuit illustrated in FIG. 16.

FIG. 17 is an enlarged plan view of a periphery of the micro-machine switch 45 used in the loaded line type phase shifter.

As illustrated, the two micro-machine switched 45 are arranged in symmetry with each other around the two strip lines 44. The micro-machine switches 45 are electrically connected to a data latching circuit (not illustrated), and are concurrently supplied a drive voltage (an external voltage) from the data latching circuit. The micro-machine switch 45 may be comprised of any one of the micro-machine switch in accordance with the first to ninth embodiments.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-365690 filed on Dec. 22, 1998 and International Application PCT/JP99/07137 filed on Dec. 20, 1999 both including specification, claims, drawings and summary is incorporated herein by reference in its entirety.

What is claimed is:

1. A micro-machine switch electrically connecting a first signal line formed on a substrate to a second signal line or electrically disconnecting said first signal line from said second signal line, said second signal line being formed on said substrate and having an end spaced away from an end of said first signal line by a certain gap, said micro-machine switch comprising:
a supporter formed on said substrate and having a predetermined height relative to a surface of said substrate;
a flexible beam projecting from said supporter in parallel with a surface of said substrate, and having a distal end facing said gap;
a contact electrode formed on a surface of said beam facing said substrate such that said contact electrode faces said gap;
a lower electrode formed on said substrate in facing relation with a part of said beam;
an intermediate electrode formed on said beam in facing relation with said lower electrode; and
an electrical insulator between said beam and said intermediate electrode and extending so as to face said gap.

2. The micro-machine switch as set forth in claim 1, wherein said supporter and at least a part of said beam are composed of the same electrically conductive material and are formed integrally with each other.

3. The micro-machine switch as set forth in claim 1, wherein said electrical conductor defines at least two cantilevers.

4. The micro-machine switch as set forth in claim 1, wherein said supporter has a floating potential.

5. The micro-machine switch as set forth in claim 1, further comprising at least one second supporter formed on said substrate, and having a predetermined height relative to a surface of said substrate, said second supporter being connected to said beam through at least one arm projecting from said second supporter in parallel with a surface of said substrate.

6. The micro-machine switch as set forth in claim 5, further comprising:
a second lower electrode formed on said substrate in facing relation with a part of said beam; and
a second intermediate electrode formed on said beam in facing relation with said second lower electrode.

7. The micro-machine switch as set forth in claim 1, wherein said lower electrode is formed on said substrate between said supporter and said gap.

8. The micro-machine switch as set forth in claim 1, wherein a surface of said supporter and a surface of said beam form an obtuse angle.

9. The micro-machine switch as set forth in claim 1, wherein said intermediate electrode has a thickness smaller than a thickness of said contact electrode.

10. The micro-machine switch as set forth in claim 1, wherein at least one of said contact electrode and said first and second signal lines is covered with an insulating film which will make capacity connection.

11. The micro-machine switch as set forth in claim 1, wherein said substrate is one of a glass substrate and a ceramic substrate.

12. The micro-machine switch as set forth in claim 1, wherein said substrate is a gallium-arsenide (GaAs) substrate.

13. The micro-machine switch as set forth in claim 1, wherein said intermediate electrode is electrically connected to said upper electrode, and said upper electrode is in an electrically floating condition.

14. The micro-machine switch as set forth in claim 1, wherein said lower electrode is comprised of a plurality of electrodes each having the same area by which each of said electrodes faces said upper electrode.

15. The micro-machine switch as set forth in claim 14, wherein each of said upper and lower electrodes comprised of a plurality of said electrodes defines a comb-shaped electrode.

16. The micro-machine switch as set forth in claim 1, wherein said upper electrode is comprised of a plurality of electrodes each having the same area by which each of said electrodes faces said lower electrode.

17. The micro-machine switch as set forth in claim 1, wherein said lower electrode is comprised of a plurality of electrodes each having the same area by which each of said electrodes faces said upper electrode, and said upper electrode is comprised of a plurality of electrodes each having the same area by which each of said electrodes faces said lower electrode.

18. The micro-machine switch as set forth in claim 1, wherein said supporter and said beam are covered at their surfaces with an insulating film.

19. The micro-machine switch as set forth in claim 18, wherein said beam is composed of silicon, and said insulating film is comprised of a film formed due to oxidation of a surface of said beam.

20. The micro-machine switch as set forth in claim 18, wherein a thickness of said insulating film on an upper surface of said beam is equal to a thickness of said insulating film on a lower surface of said beam.

21. The micro-machine switch as set forth in claim 1, wherein said beam has a multi-layered structure composed of two or more materials.

22. A micro-machine switch electrically connecting a first signal line formed on a substrate to a second signal line or electrically disconnecting said first signal line from said second signal line, said second signal line being formed on said substrate and having an end spaced away from an end of said first signal line by a certain gap,
said micro-machine switch comprising:
a supporter formed on said substrate and having a predetermined height relative to a surface of said substrate;
a flexible beam projecting from said supporter in parallel with a surface of said substrate, and having a distal end facing said gap;
a contact electrode formed on a surface of said beam facing said substrate such that said contact electrode faces said gap;
a lower electrode formed on said substrate in facing relation with a part of said beam; and
an intermediate electrode formed on said beam in facing relation with said lower electrode,
wherein said beam is comprised of an electrical conductor extending from said supporter and having such a length that said electrical conductor faces said lower electrode, and an electrical insulator extending from a distal end of said electrical conductor and having such a length that said electrical insulator faces said gap,
said contact electrode being formed on said electrical insulator in facing relation with said gap.

23. The micro-machine switch as set forth in claim 22, wherein said beam further includes an upper electrode formed integrally with said electrical conductor on said electrical insulator.

24. The micro-machine switch as set forth in claim 23, wherein said upper electrode extends across said intermediate electrode and said contact electrode.

25. The micro-machine switch as set forth in claim 23, wherein said upper electrode and said electrical insulator are formed with a through-hole which passes through said upper electrode and said electrical insulator in alignment with said lower electrode.

26. The micro-machine switch as set forth in claim 23, wherein said upper electrode, said electrical insulator and said contact electrode are formed with a through-hole which passes through said upper electrode, said electrical insulator and said contact electrode.

27. The micro-machine switch as set forth in claim 23, wherein said upper electrode has a greater thickness than a thickness of said electrical insulator.

28. The micro-machine switch as set forth in claim 23, wherein said semiconductor is single crystal semiconductor.

29. The micro-machine switch as set forth in claim 22, wherein said electrical conductor is composed of semiconductor.

30. The micro-machine switch as set forth in claim 29, wherein said semiconductor is one of amorphous semiconductor and polycrystal semiconductor.

31. A micro-machine switch electrically connecting a first signal line formed on a substrate to a second signal line or electrically disconnecting said first signal line from said second signal line, said second signal line being formed on said substrate and having an end spaced away from an end of said first signal line by a certain gap, said micro-machine switch comprising:
a supporter formed on said substrate and having a predetermined height relative to a surface of said substrate;
a flexible beam projecting from said supporter in parallel with a surface of said substrate, and having a distal end facing said gap;
an electrical insulator making contact with a lower surface of said beam, and extending from said beam in a direction in which said beam extends;
a contact electrode formed on a surface of said electrical insulator facing said substrate such that said contact electrode faces said gap;
a lower electrode formed on said substrate in facing relation with a part of said beam;
an intermediate electrode formed on said electrical insulator in facing relation with said lower electrode; and
a reinforcement formed on said electrical insulator at a side opposite to said contact electrode in alignment with said contact electrode.

32. The micro-machine switch as set forth in claim 31, wherein said reinforcement is composed of silicon.

33. The micro-machine switch as set forth in claim 31, wherein said supporter and at least a part of said beam are composed of the same electrically conductive material and are formed integrally with each other.

34. The micro-machine switch as set forth in claim 31, wherein said beam includes at least two cantilevers.

35. The micro-machine switch as set forth in claim 31, wherein said beam further includes an upper electrode formed integrally therewith on said electrical insulator.

36. The micro-machine switch as set forth in claim 35, wherein said upper electrode and said electrical insulator are formed with a through-hole which passes through said upper electrode and said electrical insulator in alignment with said lower electrode.

37. The micro-machine switch as set forth in claim 31, wherein said reinforcement, said electrical insulator and said contact electrode are formed with a through-hole which passes through said upper electrode, said electrical insulator and said contact electrode.

38. The micro-machine switch as set forth in claim 31, further comprising at least one second supporter formed on said substrate, and having a predetermined height relative to a surface of said substrate, said second supporter being connected at its lower surface to said electrical insulator through a second beam projecting from said second supporter in parallel with a surface of said substrate.

39. The micro-machine switch as set forth in claim 38, further comprising:
a second lower electrode formed on said substrate in facing relation with a part of said second beam; and
a second intermediate electrode formed on said electrical insulator in facing relation with said second lower electrode.

40. The micro-machine switch as set forth in claim 31, wherein said lower electrode is formed on said substrate between said supporter and said gap.

41. The micro-machine switch as set forth in claim 31, wherein a surface of said supporter and a surface of said beam form an obtuse angle.

42. The micro-machine switch as set forth in claim 31, wherein said intermediate electrode has a thickness smaller than a thickness of said contact electrode.

43. The micro-machine switch as set forth in claim 31, wherein at least one of said contact electrode and said first and second signal lines is covered with an insulating film which will make capacity connection.

44. The micro-machine switch as set forth in claim 31, wherein said substrate is one of a glass substrate and a ceramic substrate.

45. The micro-machine switch as set forth in claim 31, wherein said substrate is a gallium-arsenide (GaAs) substrate.

46. The micro-machine switch as set forth in claim 31, wherein said intermediate electrode is electrically connected to said upper electrode, and said upper electrode is in an electrically floating condition.

47. The micro-machine switch as set forth in claim 31, wherein said lower electrode is comprised of a plurality of electrodes each having the same area by which each of said electrodes faces said upper electrode.

48. The micro-machine switch as set forth in claim 47, wherein each of said upper and lower electrodes comprised of a plurality of said electrodes defines a comb-shaped electrode.

49. The micro-machine switch as set forth in claim 31, wherein said upper electrode is comprised of a plurality of electrodes each having the same area by which each of said electrodes faces said lower electrode.

50. The micro-machine switch as set forth in claim 31, wherein said lower electrode is comprised of a plurality of electrodes each having the same area by which each of said electrodes faces said upper electrode, and said upper electrode is comprised of a plurality of electrodes each having the same area by which each of said electrodes faces said lower electrode.

51. The micro-machine switch as set forth in claim 31, wherein said supporter and said beam are covered at their surfaces with an insulating film.

52. The micro-machine switch as set forth in claim 31, wherein said beam is composed of silicon, and said insulating film is comprised of a film formed due to oxidation of a surface of said beam.

53. The micro-machine switch as set forth in claim 31, wherein a thickness of said insulating film on an upper surface of said beam is equal to a thickness of said insulating film on a lower surface of said beam.

54. The micro-machine switch as set forth in claim 31, wherein said beam has a super-lattice structure having a multi-layered structure composed of two or more materials.

55. A micro-machine switch electrically connecting a first signal line formed on a substrate to a second signal line or electrically disconnecting said first signal line from said second signal line, said second signal line being formed on said substrate and having an end spaced away from an end of said first signal line by a certain gap, said micro-machine switch comprising:
a supporter formed on said substrate and having a predetermined height relative to a surface of said substrate;
a flexible beam projecting from said supporter in parallel with a surface of said substrate, and having a distal end facing said gap;
a first electrical insulator having a bottom in a plane in which a bottom of said beam exists, and extending from said beam in a direction in which said beam extends;
a contact electrode formed on a surface of said first electrical insulator facing said substrate such that said contact electrode faces said gap;
a lower electrode formed on said substrate in facing relation with a part of said beam;
an intermediate electrode formed on said beam in facing relation with said lower electrode; and
a reinforcement formed on said first electrical insulator at a side opposite to said contact electrode in alignment with said contact electrode.

56. The micro-machine switch as set forth in claim 55, wherein said first electrical insulator and said beam are composed of the same semiconductor.

57. The micro-machine switch as set forth in claim 55, wherein said first electrical insulator has a resistance higher than a resistance of said supporter and said beam.

58. The micro-machine switch as set forth in claim 55, further comprising a second electrical insulator formed on a lower surface of said beam in facing relation with said lower electrode, and wherein said intermediate electrode is formed on a lower surface of said second electrical insulator.

59. The micro-machine switch as set forth in claim 58, wherein said second electrical insulator has a thickness smaller than a thickness of said contact electrode.

60. The micro-machine switch as set forth in claim 55, further comprising at least one second supporter formed on said substrate, and having a predetermined height relative to a surface of said substrate, said second supporter being connected to said first electrical insulator through a second beam projecting from said second supporter in parallel with a surface of said substrate.

61. The micro-machine switch as set forth in claim 60, further comprising:
a second lower electrode formed on said substrate in facing relation with a part of said second beam; and
a second intermediate electrode formed on said second beam in facing relation with said second lower electrode.

62. The micro-machine switch as set forth in claim 61, further comprising a third electrical insulator formed on a lower surface of said second beam in facing relation with said second lower electrode, and wherein said second intermediate electrode is formed on a lower surface of said third electrical insulator.

63. The micro-machine switch as set forth in claim 55, wherein said lower electrode is formed on said substrate between said supporter and said gap.

64. The micro-machine switch as set forth in claim 55, wherein a surface of said supporter and a surface of said beam form an obtuse angle.

65. The micro-machine switch as set forth in claim 55, wherein said intermediate electrode has a thickness smaller than a thickness of said contact electrode.

66. The micro-machine switch as set forth in claim 55, wherein at least one of said contact electrode and said first and second signal lines is covered with an insulating film which will make capacity connection.

67. The micro-machine switch as set forth in claim 55, wherein said substrate is one of a glass substrate and a ceramic substrate.

68. The micro-machine switch as set forth in claim 55, wherein said substrate is a gallium-arsenide (GaAs) substrate.

69. The micro-machine switch as set forth in claim 55, wherein said intermediate electrode is electrically connected to said upper electrode, and said upper electrode is in an electrically floating condition.

70. The micro-machine switch as set forth in claim 55, wherein said lower electrode is comprised of a plurality of electrodes each having the same area by which each of said electrodes faces said upper electrode.

71. The micro-machine switch as set forth in claim 70, wherein each of said upper and lower electrodes comprised of a plurality of said electrodes defines a comb-shaped electrode.

72. The micro-machine switch as set forth in claim 55, wherein said upper electrode is comprised of a plurality of electrodes each having the same area by which each of said electrodes faces said lower electrode.

73. The micro-machine switch as set forth in claim 55, wherein said lower electrode is comprised of a plurality of electrodes each having the same area by which each of said electrodes faces said upper electrode, and said upper electrode is comprised of a plurality of electrodes each having the same area by which each of said electrodes faces said lower electrode.

74. The micro-machine switch as set forth in claim 55, wherein said supporter and said beam are covered at their surfaces with an insulating film.

75. The micro-machine switch as set forth in claim 55, wherein said beam is composed of silicon, and said insulating film is comprised of a film formed due to oxidation of a surface of said beam.

76. The micro-machine switch as set forth in claim 55, wherein a thickness of said insulating film on an upper surface of said beam is equal to a thickness of said insulating film on a lower surface of said beam.

77. The micro-machine switch as set forth in claim 55, wherein said beam has a super-lattice structure having a multi-layered structure composed of two or more materials.

78. A micro-machine switch electrically connecting a first signal line formed on a substrate to a second signal line or electrically disconnecting said first signal line from said second signal line, said second signal line being formed on said substrate and having an end spaced away from an end of said first signal line by a certain gap, said micro-machine switch comprising:
a supporter formed on said substrate and having a predetermined height relative to a surface of said substrate;
a flexible beam projecting from said supporter in parallel with a surface of said substrate, and having a distal end facing said gap;
a first electrical insulator making contact with a lower surface of said beam, and extending from said beam in a direction in which said beam extends;
a contact electrode formed on a surface of said first electrical insulator facing said substrate such that said contact electrode faces said gap;
a lower electrode formed on said substrate in facing relation with a part of said beam;
an intermediate electrode formed on said first electrical insulator in facing relation with said lower electrode, and electrically connected to said beam; and a reinforcement formed on said first electrical insulator at a side opposite to said contact electrode in alignment with said contact electrode.

79. The micro-machine switch as set forth in claim 78, wherein said first electrical insulator is formed with a hole, which is filled with an electrical conductor through which said intermediate electrode and said beam.

80. The micro-machine switch as set forth in claim 78, further comprising a first insulating film which at least partially covers at least one of said intermediate electrode and said lower electrode.

81. The micro-machine switch as set forth in claim 80, wherein said first insulating film at least partially covers said intermediate electrode, and a sum of thicknesses of said intermediate electrode and said first insulating film is smaller than a thickness of said contact electrode.

82. The micro-machine switch as set forth in claim 78, further comprising a second insulating film which at least partially covers at least one of said contact electrode and said first and second signal lines.

83. The micro-machine switch as set forth in claim 82, wherein said second insulating film at least partially covers said contact electrode, and a sum of thicknesses of said contact electrode and said second insulating film is greater than a thickness of said intermediate electrode.

84. The micro-machine switch as set forth in claim 78, wherein said lower electrode is formed on said substrate between said supporter and said gap.

85. The micro-machine switch as set forth in claim 78, wherein a surface of said supporter and a surface of said beam form an obtuse angle.

86. The micro-machine switch as set forth in claim 78, wherein said intermediate electrode has a thickness smaller than a thickness of said contact electrode.

87. The micro-machine switch as set forth in claim 78, wherein at least one of said contact electrode and said first and second signal lines is covered with an insulating film which will make capacity connection.

88. The micro-machine switch as set forth in claim 78, wherein said substrate is one of a glass substrate and a ceramic substrate.

89. The micro-machine switch as set forth in claim 78, wherein said substrate is a gallium-arsenide (GaAs) substrate.

90. The micro-machine switch as set forth in claim 78, wherein said intermediate electrode is electrically connected to said upper electrode, and said upper electrode is in an electrically floating condition.

91. The micro-machine switch as set forth in claim 78, wherein said lower electrode is comprised of a plurality of electrodes each having the same area by which each of said electrodes faces said upper electrode.

92. The micro-machine switch as set forth in claim 91, wherein each of said upper and lower electrodes comprised of a plurality of said electrodes defines a comb-shaped electrode.

93. The micro-machine switch as set forth in claim 78, wherein said upper electrode is comprised of a plurality of electrodes each having the same area by which each of said electrodes faces said lower electrode.

94. The micro-machine switch as set forth in claim 78, wherein said lower electrode is comprised of a plurality of electrodes each having the same area by which each of said electrodes faces said upper electrode, and said upper electrode is comprised of a plurality of electrodes each having the same area by which each of said electrodes faces said lower electrode.

95. The micro-machine switch as set forth in claim 78, wherein said supporter and said beam are covered at their surfaces with an insulating film.

96. The micro-machine switch as set forth in claim 78, wherein said beam is composed of silicon, and said insulating film is comprised of a film formed due to oxidation of a surface of said beam.

97. The micro-machine switch as set forth in claim 78, wherein a thickness of said insulating film on an upper surface of said beam is equal to a thickness of said insulating film on a lower surface of said beam.

98. The micro-machine switch as set forth in claim 78, wherein said beam has a super-lattice structure having a multi-layered structure composed of two or more materials.

99. A phased-array antenna comprising at least one phase shifter including a micro-machine switch for each of bits, said micro-machine switch electrically connecting a first signal line formed on a substrate to a second signal line or electrically disconnecting said first signal line from said second signal line, said second signal line being formed on said substrate and having an end spaced away from an end of said first signal line by a certain gap, said micro-machine switch comprising:

a supporter formed on said substrate and having a predetermined height relative to a surface of said substrate;

a flexible beam projecting from said supporter in parallel with a surface of said substrate, and having a distal end facing said gap;

a contact electrode formed on a surface of said beam facing said substrate such that said contact electrode faces said gap;

a lower electrode formed on said substrate in facing relation with a part of said beam; and an intermediate electrode formed on said beam in facing relation with said lower electrode.

100. A phased-array antenna comprising at least one phase shifter including a micro-machine switch for each of bits, said micro-machine switch electrically connecting a first signal line formed on a substrate to a second signal line or electrically disconnecting said first signal line from said second signal line, said second signal line being formed on said substrate and having an end spaced away from an end of said first signal line by a certain gap, said micro-machine switch comprising:

a supporter formed on said substrate and having a predetermined height relative to a surface of said substrate;

a flexible beam projecting from said supporter in parallel with a surface of said substrate, and having a distal end facing said gap;

an electrical insulator making contact with a lower surface of said beam, and extending from said beam in a direction in which said beam extends;

a contact electrode formed on a surface of said electrical insulator facing said substrate such that said contact electrode faces said gap;

a lower electrode formed on said substrate in facing relation with a part of said beam;

an intermediate electrode formed on said electrical insulator in facing relation with said lower electrode; and a reinforcement formed on said electrical insulator at a side opposite to said contact electrode in alignment with said contact electrode.

101. A phased-array antenna comprising at least one phase shifter including a micro-machine switch for each of bits, said micro-machine switch electrically connecting a first signal line formed on a substrate to a second signal line or electrically disconnecting said first signal line from said second signal line, said second signal line being formed on said substrate and having an end spaced away from an end of said first signal line by a certain gap, said micro-machine switch comprising:

a supporter formed on said substrate and having a predetermined height relative to a surface of said substrate;

a flexible beam projecting from said supporter in parallel with a surface of said substrate, and having a distal end facing said gap;

a first electrical insulator having a bottom in a plane in which a bottom of said beam exists, and extending from said beam in a direction in which said beam extends;

a contact electrode formed on a surface of said first electrical insulator facing said substrate such that said contact electrode faces said gap;

a lower electrode formed on said substrate in facing relation with a part of said beam;

an intermediate electrode formed on said beam in facing relation with said lower electrode; and a reinforcement formed on said first electrical insulator at a side opposite to said contact electrode in alignment with said contact electrode.

102. A phased-array antenna comprising at least one phase shifter including a micro-machine switch for each of bits, said micro-machine switch electrically connecting a first signal line formed on a substrate to a second signal line or electrically disconnecting said first signal line from said second signal line, said second signal line being formed on said substrate and having an end spaced away from an end of said first signal line by a certain gap, said micro-machine switch comprising:

a supporter formed on said substrate and having a predetermined height relative to a surface of said substrate;

a flexible beam projecting from said supporter in parallel with a surface of said substrate, and having a distal end facing said gap;

a first electrical insulator making contact with a lower surface of said beam, and extending from said beam in a direction in which said beam extends;

a contact electrode formed on a surface of said first electrical insulator facing said substrate such that said contact electrode faces said gap;

a lower electrode formed on said substrate in facing relation with a part of said beam;

an intermediate electrode formed on said first electrical insulator in facing relation with said lower electrode, and electrically connected to said beam; and a reinforcement formed on said first electrical insulator at a side opposite to said contact electrode in alignment with said contact electrode.

103. A phased-array antenna comprising:

M antennas (M is an integer equal to or greater than 2);

a data distributing circuit;

M data latching circuits each electrically connected to said data distributing circuit;

M N-bit phase-shifters each electrically connected to both an associated data latching circuit and an associated antenna (N is a positive integer);

a power feed which feeds electric power to each of said phase-shifters; and a controller electrically connected to each of said data latching circuits and said data distributing circuit, each of said phase-shifters includes a micro-machine switch for each of bits, each of said data latching circuits is electrically connected to said micro-machine switch of the associated phase-shifter, said controller calculates with N-bit accuracy a degree of phase-shifting optimal for directing a radiated beam towards a desired direction, based on predetermined location and frequency of said antenna, and transmits the calculation result to each of said data latching circuits through said data distributing circuit, each of said phase-shifters applies a drive voltage to a micro-machine switch associated with a bit required by each of said phase-shifters, determine a degree of phase-shifting of each of said phase-shifters, alters a phase of a radio-frequency signal in accordance with the thus determined degree of phase-shifting, and supplies electric power to each of antennas, said micro-machine switch electrically connecting a first signal line formed on a substrate to a second signal line or electrically disconnecting said first signal line from said second signal line, said second signal line being formed on said substrate and having an end spaced away from an end of said first signal line by a certain gap, said micro-machine switch comprising:

a supporter formed on said substrate and having a predetermined height relative to a surface of said substrate;

a flexible beam projecting from said supporter in parallel with a surface of said substrate, and having a distal end facing said gap;

a contact electrode formed on a surface of said beam facing said substrate such that said contact electrode faces said gap;

a lower electrode formed on said substrate in facing relation with a part of said beam; and an intermediate electrode formed on said beam in facing relation with said lower electrode.

104. A phased-array antenna comprising:

M antennas (M is an integer equal to or greater than 2);

a data distributing circuit;

M data latching circuits each electrically connected to said data distributing circuit;

M N-bit phase-shifters each electrically connected to both an associated data latching circuit and an associated antenna (N is a positive integer);

a power feeder which feeds electric power to each of said phase-shifters; and a controller electrically connected to each of said data latching circuits and said data distributing circuit, each of said phase-shifters includes a micro-machine switch for each of bits, each of said data latching circuits is electrically connected to said micro-machine switch of the associated phase-shifter, said controller calculates with N-bit accuracy a degree of phase-shifting optimal for directing a radiated beam towards a desired direction, based on predetermined location and frequency of said antenna, and transmits the calculation result to each of said data latching circuits through said data distributing circuit, each of said phase-shifters applies a drive voltage to a micro-machine switch associated with a bit required by each of said phase-shifters, determines a degree of phase-shifting of each of said phase-shifters, alters a phase of a radio-frequency signal in accordance with the thus determined degree of phase-shifting, and supplies electric power to each of antennas, said micro-machine switch electrically connecting a first signal line formed on a substrate to a second signal line or electrically disconnecting said first signal line from said second signal line, said second signal line being formed on said substrate and having an end spaced away from an end of said first signal line by a certain gap, said micro-machine switch comprising:

a supporter formed on said substrate and having a predetermined height relative to a surface of said substrate;

a flexible beam projecting from said supporter in parallel with a surface of said substrate, and having a distal end facing said gap;

an electrical insulator making contact with a lower surface of said beam, and extending from said beam in a direction in which said beam extends;

a contact electrode formed on a surface of said electrical insulator facing said substrate such that said contact electrode faces said gap;

a lower electrode formed on said substrate in facing relation with a part of said beam;

an intermediate electrode formed on said electrical insulator in facing relation with said lower electrode; and a reinforcement formed on said electrical insulator at a side opposite to said contact electrode in alignment with said contact electrode.

105. A phased-array antenna comprising:

M antennas (M is an integer equal to or greater than 2);

a data distributing circuit;

M data latching circuits each electrically connected to said data distributing circuit;

M N-bit phase-shifters each electrically connected to both an associated data latching circuit and an associated antenna (N is a positive integer);

a power feeder which feeds electric power to each of said phase-shifters; and a controller electrically connected to each of said data latching circuits and said data distributing circuit, each of said phase-shifters includes a micro-machine switch for each of bits, each of said data latching circuits is electrically connected to said micro-machine switch of the associated phase-shifter, said controller calculates with N-bit accuracy a degree of phase-shifting optimal for directing a radiated beam towards a desired direction, based on predetermined location and frequency of said antenna, and transmits the calculation result to each of said data latching circuits through said data distributing circuit, each of said phase-shifters applies a drive voltage to a micro-machine switch associated with a bit required by each of said phase-shifters, determines a degree of phase-shifting of each of said phase-shifters, alters a phase of a radio-frequency signal in accordance with the thus determined degree of phase-shifting, and supplies electric power to each of antennas, said micro-machine switch electrically connecting a first signal line formed on a substrate to a second signal line or electrically disconnecting said first signal line from said second signal line, said second signal line being formed on said substrate and having an end spaced away from an end of said first signal line by a certain gap, said micro-machine switch comprising:

a supporter formed on said substrate and having a predetermined height relative to a surface of said substrate;

a flexible beam projecting from said supporter in parallel with a surface of said substrate, and having a distal end facing said gap;

a first electrical insulator having a bottom in a plane in which a bottom of said beam exists, and extending from said beam in a direction in which said beam extends;

a contact electrode formed on a surface of said first electrical insulator facing said substrate such that said contact electrode faces said gap;

a lower electrode formed on said substrate in facing relation with a part of said beam;

an intermediate electrode formed on said beam in facing relation with said lower electrode; and a reinforcement formed on said first electrical insulator at a side opposite to said contact electrode in alignment with said contact electrode.

106. A phased-array antenna comprising:

M antennas (M is an integer equal to or greater than 2);

a data distributing circuit;

M data latching circuits each electrically connected to said data distributing circuit;

M N-bit phase-shifters each electrically connected to both an associated data latching circuit and an associated antenna (N is a positive integer);

a power feeder which feeds electric power to each of said phase-shifters; and a controller electrically connected to each of said data latching circuits and said data distributing circuit, each of said phase-shifters includes a micro-machine switch for each of bits, each of said data latching circuits is electrically connected to said micro-machine switch of the associated phase-shifter, said controller calculates with N-bit accuracy a degree of phase-shifting optimal for directing a radiated beam towards a desired direction, based on predetermined location and frequency of said antenna, and transmits the calculation result to each of said data latching circuits through said data distributing circuit, each of said phase-shifters applies a drive voltage to a micro-machine switch associated with a bit required by each of said phase-shifters, determines a degree of phase-shifting of each of said phase-shifters, alters a phase of a radio-frequency signal in accordance with the thus determined degree of phase-shifting, and supplies electric power to each of antennas, said micro-machine switch electrically connecting a first signal line formed on a substrate to a second signal line or electrically disconnecting said first signal line from said second signal line, said second signal line being formed on said substrate and having an end spaced away from an end of said first signal line by a certain gap, said micro-machine switch comprising:

a supporter formed on said substrate and having a predetermined height relative to a surface of said substrate;

a flexible beam projecting from said supporter in parallel with a surface of said substrate, and having a distal end facing said gap;

a first electrical insulator making contact with a lower surface of said beam, and extending from said beam in a direction in which said beam extends;

a contact electrode formed on a surface of said first electrical insulator facing said substrate such that said contact electrode faces said gap;

a lower electrode formed on said substrate in facing relation with a part of said beam;

an intermediate electrode formed on said first electrical insulator in facing relation with said lower electrode, and electrically connected to said beam; and a reinforcement formed on said first electrical insulator at a side opposite to said contact electrode in alignment with said contact electrode.

107. A method of fabricating a micro-machine switch, comprising the steps of:

etching a substrate at areas except a first area to thereby turn said first area into a raised portion;

diffusing impurities into said first area and a second area of said substrate, which second area is a different area from said first area;

diffusing impurities into a third area which connects said first and second areas to each other;

forming an electrical insulator on said second area;

forming first and second electrodes on said electrical insulator above said second area;

forming a third electrode and a pair of signal lines on a second substrate;

adhering an upper surface of said first area of said substrate onto said second substrate such that said first electrode faces said pair of signal lines and said second electrode faces said third electrode; and removing areas of said substrate except area into which impurities have been diffused.

108. The method as set forth in claim 107, wherein said substrate is composed of silicon, said second substrate is composed of glass, and said substrate and said second substrate are electrostatically coupled to each other.

109. The method as set forth in claim 107, wherein said second substrate is composed of one of ceramic and gallium-arsenide (GaAs), and said substrate and said second substrate are adhered to each other through an adhesive.

110. The method as set forth in claim 107, wherein said second substrate is composed of one of ceramics and gallium-arsenide (GaAs), and further comprising the step of forming a thin glass film on said second substrate, said substrate and said second substrate being electrostatically coupled to each other.

111. The method as set forth in claim 107, wherein said step of removing areas of said substrate includes the step of dipping said substrate into an etching solution having a characteristic of selecting a concentration of said impurities, to thereby solve areas into which said impurities have not been diffused.

112. A method of fabricating a micro-machine switch, comprising the steps of:

etching a substrate at areas except first and second areas to thereby turn said first and second areas into raised portions;

diffusing impurities into said first area, said second area, and a third area of said substrate located between said first and second areas;

diffusing impurities into both a fourth area which connects said first and third areas to each other, and a fifth area which connects said second and third areas to each other;

forming an electrical insulator on said third area;

forming first and second electrodes on said electrical insulator above said third area;

forming a third electrode and a pair of signal lines on a second substrate;

adhering upper surfaces of said first and second areas of said substrate onto said second substrate such that said first electrode faces said pair of signal lines and said second electrode faces said third electrode; and removing areas of said substrate except area into which impurities have been diffused.

113. The method as set forth in claim 112, wherein said substrate is composed of silicon, said second substrate is composed of glass, and said substrate and said second substrate are electrostatically coupled to each other.

114. The method as set forth in claim 112, wherein said second substrate is composed of one of ceramic and gallium-arsenide (GaAs), and said substrate and said second substrate are adhered to each other through an adhesive.

115. The method as set forth in claim 112, wherein said second substrate is composed of one of ceramics and gallium-arsenide (GaAs), and further comprising the step of forming a thin glass film on said second substrate, said substrate and said second substrate being electrostatically coupled to each other.

116. The method as set forth in claim 112, wherein said step of removing areas of said substrate includes the step of dipping said substrate into an etching solution having a characteristic of selecting a concentration of said impurities, to thereby solve areas into which said impurities have not been diffused.

117. A method of fabricating a micro-machine switch, comprising the steps of:

etching a substrate at areas except a first area to thereby turn said first area into a raised portion;

diffusing impurities into said first area, a third area, and a second area located between said first and second areas;

diffusing impurities into a fourth area which connects said first and second areas to each other;

forming an electrical insulator across said second and third areas on said substrate;

forming a first electrode on said electrical insulator above said third area, and further forming a second electrode on said electrical insulator above said second area;

forming a third electrode and a pair of signal lines on a second substrate;

adhering an upper surface of said first area of said substrate onto said second substrate such that said first electrode faces said pair of signal lines and said second electrode faces said third electrode; and removing areas of said substrate except area into which impurities have been diffused.

118. The method as set forth in claim 117, further comprising the steps of:

forming a through-hole through said electrical insulator such that said through-hole reaches said second area; and filling said through-hole with an electrical conductor such that said second electrode is electrically connected to said second area through said electrical conductor.

119. The method as set forth in claim 117, further comprising the step of covering said first and second electrodes with an electrical insulator.

120. The method as set forth in claim 117, wherein said substrate is composed of silicon, said second substrate is composed of glass, and said substrate and said second substrate are electrostatically coupled to each other.

121. The method as set forth in claim 117, wherein said second substrate is composed of one of ceramic and gallium-arsenide (GaAs), and said substrate and said second substrate are adhered to each other through an adhesive.

122. The method as set forth in claim 117, wherein said second substrate is composed of one of ceramics and gallium-arsenide (GaAs), and further comprising the step of forming a thin glass film on said second substrate, said substrate and said second substrate being electrostatically coupled to each other.

123. The method as set forth in claim 117, wherein said step of removing areas of said substrate includes the step of dipping said substrate into an etching solution having a characteristic of selecting a concentration of said impurities, to thereby solve areas into which said impurities have not been diffused.

124. A method of fabricating a micro-machine switch, comprising the steps of:

etching a substrate at areas except first and second areas to thereby turn said first and second areas into raised portions;

diffusing impurities into said first area, said second area, a third area located between said first and second areas, a fourth area located between said second and third areas, and a fifth area located between said second and fourth areas;

diffusing impurities into both a sixth area which connects said first and third areas to each other, and a seventh area which connects said second and fifth areas to each other;

forming an electrical insulator extending across said third and fifth areas on said substrate;

forming a first electrode on said electrical insulator above said third area, forming a second electrode on said electrical insulator above said fourth area, and further forming a third electrode on said electrical insulator above said fifth area;

forming a fourth electrode, a fifth substrate and a pair of signal lines on a second substrate;

adhering upper surfaces of said first and second areas of said substrate onto said second substrate such that said second electrode faces said pair of signal lines, said first electrode faces said fourth electrode, and said third electrode faces said fifth electrode; and removing areas of said substrate except area into which impurities have been diffused.

125. The method as set forth in claim 124, further comprising the steps of:

forming first and second through-holes through said electrical insulator such that said first through-hole reaches said third area and said second through-hole reaches said fourth area; and filling said first and second through-holes with an electrical conductor such that said first electrode is electrically connected to said third area through said electrical conductor and said second electrode is electrically connected to said fourth area through said electrical conductor.

126. The method as set forth in claim 125, further comprising the step of covering said first, second and third electrodes with an electrical insulator.

127. The method as set forth in claim 125, wherein said substrate is composed of silicon; said second substrate is composed of glass, and said substrate and said second substrate are electrostatically coupled to each other.

128. The method as set forth in claim 125, wherein said second substrate is composed of one of ceramic and gallium-arsenide (GaAs), and said substrate and said second substrate are adhered to each other through an adhesive.

129. The method as set forth in claim 125, wherein said second substrate is composed of one of ceramics and gallium-arsenide (GaAs), and further comprising the step of forming a thin glass film on said second substrate, said substrate and said second substrate being electrostatically coupled to each other.

130. The method as set forth in claim 125, wherein said step of removing areas of said substrate includes the step of dipping said substrate into an etching solution having a characteristic of selecting a concentration of said impurities, to thereby solve areas into which said impurities have not been diffused.

131. A method of fabricating a micro-machine switch, comprising the steps of:

etching a substrate at areas except a first area to thereby turn said first area into a raised portion;

diffusing impurities into said first area, a third area, and a second area located between said first and second areas;

diffusing impurities into a fourth area which connects said first and second areas to each other;

etching said substrate in a fifth area connecting said second and third areas to each other to thereby form a recess in said fifth area;

filling said recess with an electrical insulator;

forming an electrical insulator on said second area;

forming a first electrode on said electrical insulator above said third area, and further forming a second electrode on said electrical insulator above said second area;

forming a third electrode and a pair of signal lines on a second substrate;

adhering an upper surface of said first area of said substrate onto said second substrate such that said first electrode faces said pair of signal lines and said second electrode faces said third electrode; and removing areas of said substrate except area into which impurities have been diffused.

132. The method as set forth in claim 131, wherein said substrate is composed of silicon, said second substrate is composed of glass, and said substrate and said second substrate are electrostatically coupled to each other.

133. The method as set forth in claim 131, wherein said second substrate is composed of one of ceramic and gallium-arsenide (GaAs), and said substrate and said second substrate are adhered to each other through an adhesive.

134. The method as set forth in claim 131, wherein said second substrate is composed of one of ceramics and gallium-arsenide (GaAs), and further comprising the step of forming a thin glass film on said second substrate, said substrate and said second substrate being electrostatically coupled to each other.

135. The method as set forth in claim 131, wherein said step of removing areas of said substrate includes the step of dipping said substrate into an etching solution having a characteristic of selecting a concentration of said impurities, to thereby solve areas into which said impurities have not been diffused.

136. A method of fabricating a micro-machine switch, comprising the steps of:

- etching a substrate at areas except first and second areas to thereby turn said first and second areas into raised portions;
- diffusing impurities into said first and second areas, a third area located between said first and second areas, a fourth area located between said second and third areas, and a fifth area located between said third and fourth areas;
- diffusing impurities into both a sixth area which connects said first and third areas to each other a seventh area which connects said second and fourth areas to each other;
- etching said substrate in an eighth area connecting said third and fourth areas to each other to thereby form a recess in said eighth area;
- filling said recess with an electrical insulator;
- forming a first electrical insulator on said third area, and further forming a second electrical insulator on said fourth area;
- forming a first electrode on said electrical insulator above said fifth area, forming a second electrode on said first electrical insulator above said third area, and further forming a third electrode on said second electrical insulator above said fourth area;
- forming a fifth electrode and a pair of signal lines on a second substrate;
- adhering upper surfaces of said first and second areas of said substrate onto said second substrate such that said first electrode faces said pair of signal lines, said second electrode faces said fourth electrode, and said third electrode faces said fifth electrode; and
- removing areas of said substrate except area into which impurities have been diffused.

137. The method as set forth in claim 136, wherein said substrate is composed of silicon, said second substrate is composed of glass, and said substrate and said second substrate are electrostatically coupled to each other.

138. The method as set forth in claim 136, wherein said second substrate is composed of one of ceramic and gallium-arsenide (GaAs), and said substrate and said second substrate are adhered to each other through an adhesive.

139. The method as set forth in claim 136, wherein said second substrate is composed of one of ceramics and gallium-arsenide (GaAs), and further comprising the step of forming a thin glass film on said second substrate, said substrate and said second substrate being electrostatically coupled to each other.

140. The method as set forth in claim 136, wherein said step of removing areas of said substrate includes the step of dipping said substrate into an etching solution having a characteristic of selecting a concentration of said impurities, to thereby solve areas into which said impurities have not been diffused.

* * * * *